(12) United States Patent  
Zhang et al.

(10) Patent No.: US 8,685,841 B2  
(45) Date of Patent: Apr. 1, 2014

(54) METHODS FOR THE PRODUCTION OF NANOSCALE HETEROSTRUCTURES

(75) Inventors: Jiatao Zhang, Beijing (CN); Yun Tang, Cambridge, MA (US); Min Ouyang, Kensington, MD (US)

(73) Assignee: University of Maryland College Park, College Park, MD (US)

( * ) Notice: Subject to any disclaimer, the term of this patent is extended or adjusted under 35 U.S.C. 154(b) by 108 days.

(21) Appl. No.: 13/428,516

(22) Filed: Mar. 23, 2012

(65) Prior Publication Data

US 2012/0267605 A1   Oct. 25, 2012

Related U.S. Application Data

(60) Provisional application No. 61/467,994, filed on Mar. 26, 2011.

(51) Int. Cl.
*H01L 29/26* (2006.01)

(52) U.S. Cl.
USPC ...... 438/478; 257/12; 257/E29.081; 977/774; 977/825; 977/832

(58) Field of Classification Search
USPC ........ 977/774, 824, 825, 932; 257/12, 13, 24, 257/E29.071, E29.081, 14; 438/478, 933
See application file for complete search history.

(56) References Cited

PUBLICATIONS

Alemseghed, M.G. et al. (2011) *"Controlled Fabrication of Colloidal Semiconductor—Metal Hybrid Heterostructures: Site Selective Metal Photo Deposition,"* Chem. Mater. 23:3571-3579.

Anson C.E. et al. (2008) *"Synthesis and Crystal Structures of the Ligand-Stabilized Silver Chalcogenide Clusters* $[Ag_{154}Se_{77}(dppxy)_{18}]$, $[Ag_{320}(StBu)_{60}S_{130}(dppp)_{12}]$, $[Ag_{352}S_{128}(StC_5H_{11})_{96}]$, *and* $[Ag_{490}S_{188}(StC_5H_{11})_{114}]$," Angew. Chem. Int. Ed. 47(7):1326-1331.

Battaglia, D. et al. (2003) *"Colloidal Two-Dimensional Systems: CdSe Quantum Shells and Wells,"* Angew. Chem. Int. Ed. 42(41):5035-5039.

Bording, J.K. et al. (2000) *"Molecular-Dynamics Simulation of Growth of Nanocrystals in an Amorphous Matrix,"* Phys. Rev. B 62912):8098-8103.

Cao, Y.C. (2002) *"Nanoparticles With Raman Spectroscopic Fingerprints for DNA and RNA Detection,"* Science 297:1536-1540.

Cao, Y.C. (2008) *"Morphology of Template-Grown Polyaniline Nanowires and Its Effect on the Electrochemical Capacitance of Nanowire Arrays,"* Chem. Mater. 20:5260-5265.

Caruge, J. M. et al. (2008) *"Colloidal Quantum-Dot Light-Emitting Diodes With Metal-Oxide Charge Transport Layers,"* Nat. Photonics 2(4):247-250.

(Continued)

*Primary Examiner* — Matthew Such
*Assistant Examiner* — Scott Stowe
(74) *Attorney, Agent, or Firm* — William C. Schrot; Jeffrey I. Auerbach; AuerbachSchrot LLC

(57) ABSTRACT

The present invention is directed to a novel synthetic method for producing nanoscale heterostructures, and particularly nanoscale heterostructure particles, rods and sheets, that comprise a metal core and a monocrystalline semiconductor shell with substantial lattice mismatches between them. More specifically, the invention concerns the use of controlled soft acid-base coordination reactions between molecular complexes and colloidal nanostructures to drive the nanoscale monocrystalline growth of the semiconductor shell with a lattice structure incommensurate with that of the core. The invention also relates to more complex hybrid core-shell structures that exhibit azimuthal and radial nano-tailoring of structures. The invention is additionally directed to the use of such compositions in semiconductor devices.

19 Claims, 13 Drawing Sheets

(56) References Cited

PUBLICATIONS

Chandrasekharan, N. et al. (2000) "*Improving the Photoelectrochemical Performance of Nanostructured TiO2 Films by Adsorption of Gold Nanoparticles,*" J. Phys. Chem. B 104(46):10851-10857.

Chen, X.B. et al. (2003) "*Coherency Strain Effects on the Optical Response of Core/Shell Heteronanostructures,*" Nano Lett. 3(6):799-803.

Collier, C.P. et al. (1997) "*Reversible Tuning of Silver Quantum Dot Monolayers Through the Metal-Insulator Transition,*" Science 277:1978-1981.

Cui, Y. et al. (2001) "*Nanowire Nanosensors for Highly Sensitive and Selective Detection of Biological and Chemical Species,*" Science 293(5533):1289-1292.

Endo, H. et al. (2007) "*Schottky Ultraviolet Photodiode Using a ZnO Hydrothermally Grown Single Crystal Substrate,*" Appl. Phys. Lett. 90(12):121906-121908.

Hirakawa, T. et al. (2005) "*Charge Separation and Catalytic Activity of Ag@TiO₂ Core—Shell Composite Clusters under UV-Irradiation,*" J. Am. Chem. Soc. 127(11):3928-3934.

Hoffman, J.D. (1958) "*Thermodynamic Driving Force in Nucleation and Growth Processes,*" J. Chem. Phys. 29(5):1192-1193.

Jeong, U.Y. et al. (2005) "*Large-Scale Synthesis of Single-Crystal CdSe Nanowires Through a Cation-Exchange Route,*" Chem. Phys. Lett. 416(4-6):246-250.

Jin, R. et al. (2003) "*Controlling Anisotropic Nanoparticle Growth Through Plasmon Excitation,*" Nature 425:487-490.

Jin, Y.D. et al. (2009) "*Plasmonic Fluorescent Quantum Dots,*" Nat. Nanotechnol. 4(9):571-576.

Kim, H. et al. (2005) "*Synthesis and Characterization of Co/CdSe Core/Shell Nanocomposites: Bifunctional Magnetic-Optical Nanocrystals,*" J. Am. Chem. Soc. 127(2):544-546.

Kim, S. et al. (2003) "*Type-II Quantum Dots: CdTe/CdSe(Core/Shell) and CdSe/ZnTe(Core/Shell) Heterostructures,*" J. Am. Chem. Soc. 125(38):11466-11467.

Klimov, V.I. et al. (2007) "*Single-Exciton Optical Gain in Semiconductor Nanocrystals,*" Nature 447(7143):441-446.

Kundu, P. et al. (epub Dec. 15, 2009) "*Nanoscale Heterostructures with Molecular-Scale Single-Crystal Metal Wires,*" J. Am. Chem. Soc. 132:20-21.

Lee, J.S. (2008) "*Au—PbS Core-Shell Nanocrystals: Plasmonic Absorption Enhancement and Electrical Doping via Intra particle Charge Transfer,*" J. Am. Chem. Soc. 130(30):9673-9675.

Lu, W. et al. (2007) "*Nanoelectronics From The Bottom Up,*" Nat. Mater. 6(11):841-850.

Maier, S.A. et al. (2003) "*Local Detection of Electromagnetic Energy Transport Below The Diffraction Limit In Metal Nanoparticle Plasmon Waveguides,*" Nature Mater. 2:229-232.

Maynor, B.W. et al. (2004) "*Site-Specific Fabrication of Nanoscale Heterostructures: Local Chemical Modification of GaN Nanowires Using Electrochemical Dip-Pen Nanolithography,*" J. Am. Chem. Soc. 126:6409-6413.

McAlpine, M. C. et al. (2007) "*Highly Ordered Nanowire Arrays on Plastic Substrates for Ultrasensitive Flexible Chemical Sensors,*" Nat. Mater. 6:379-384.

McBride, J. et al. (2006) "*Structural Basis for Near Unity Quantum Yield Core/Shell Nanostructures,*" Nano Lett. 697):1496-1501.

Misono, M. et al. (1967) "*A New Dual Parameter Scale for the Strength of Lewis Acids and Bases With the Evaluation of Their Softness,*" J. Inorg. Nucl. Chem. 29, 2685-2691.

Mokari, T. et al. (2004) "*Selective Growth of Metal Tips onto Semiconductor Quantum Rods and Tetrapods,*" Science 304(5678):1787-1790.

Mokari, T. et al. (2005) "*Formation of Asymmetric One-Sided Metal-Tipped Semiconductor Nanocrystal Dots and Rods,*" Nat. Mater. 4(11):855-863.

Murray, C. B. et al. (2000) "*Synthesis and Characterization of Monodisperse Nanocrystals and Close-Packed Nanocrystal Assemblies,*" Annu. Rev. Mater. Sci. 30, 545-610.

Nakato, Y. et al. (2002) "*Effect of Microscopic Discontinuity of Metal Overlayers on the Photovoltages In Metal-Coated Semiconductor-Liquid Junction Photoelectrochemical Cells for Efficient Solar Energy Conversion,*" J. Phys. Chem. 92 (8):2316-2324.

Nie, S. et al. (1997) "*Probing Single Molecules and Single Nanoparticles by Surface Enhanced Raman Scattering,*" Science 275:1102-1106.

Palmstrøm, C.J. (1995) "*Epitaxy of Dissimilar Materials,*" Annu Rev. Mater. Sci. 25:389-415.

Pan, A.L. et al. (2006) "*High-Quality Alloyed $CdS_xSe_{1-x}$ Whiskers as Waveguides with Tunable Stimulated Emission,*" J. Phys. Chem. B 110(45):22313-22317.

Pearson, R. G. (1963) "*Hard and Soft Acids and Bases,*" J. Am. Chem. Soc. 85(22):3533-3539.

Peng, X.G. et al. (1997) "*Epitaxial Growth of Highly Luminescent CdSe/CdS Core/Shell Nanocrystals with Photostability and Electronic Accessibility,*" J. Am. Chem. Soc. 119(30):7019-7029.

Pompa, P.P. et al. (2006) "*Metal-Enhanced Fluorescence of Colloidal Nanocrystals With Nanoscale Control,*" Nat. Nanotechnol. 1(2):126-130.

Sargent, E.H. (2009) "*Infrared Photovoltaics Made by Solution Processing,*" Nat. Photonics 3(6):325-331.

Sherry, L.J. et al. (2006) "*Localized Surface Plasmon Resonance Spectroscopy of Single Silver Triangular Nanoprisms,*" Nano Lett. 6:2060-2065.

Shimizu, K.T. et al. (2002) "*Surface-Enhanced Emission from Single Semiconductor Nanocrystals,*" Phys. Rev. Lett. 89(11):117401-117402.

Smith, A.M. et al. (2009) "*Tuning the Optical and Electronic Properties of Colloidal Nanocrystals by Lattice Strain,*" Nat. Nanotechnol. 4(1):56-63.

Smith, A.M. et al. (2010) "*Semiconductor Nanocrystals: Structure, Properties, and Band Gap Engineering,*" Acc. Chem. Res. 43(2):190-200.

Son, D.H. et al. (2004) "*Cation Exchange Reactions in Ionic Nanocrystals,*" Science 306(5698):1009-1012.

Sönnichsen, C. et al. (2005) "*A Molecular Ruler Based on Plasmon Coupling of Single Gold and Silver Nanoparticles,*" Nature Biotechnol. 23:741-745.

Subramanian, V. et al. (2004) "*Catalysis with TiO2/Gold Nanocomposites. Effect of Metal Particle Size on the Fermi Level Equilibration,*" J. Am. Chem. Soc. 126(15):4943-4950.

Sun, S. et al. (2000) "*Monodisperse FePt nanoparticles and ferromagnetic FePt nanocrystal superlattices,*" Science 287:1989-1992.

Sun, Y. et al. (2002) "*Shape-Controlled Synthesis of Gold and Silver Nanoparticles,*" Science 298:2176-2179.

Tang, Y. et al. (epub Aug. 19, 2007) "*Tailoring Properties and Functionalities of Metal Nanoparticles Through Crystallinity Engineering,*"Nature 6:754-759.

Turnbull, D. (1950) "*Formation of Crystal Nuclei in Liquid Metals,*" J. Appl. Phys. 21(10):1022-1028.

Valden, M. et al. (1998) "*Onset of Catalytic Activity of Gold Clusters on Titania with the Appearance of Nonmetallic Properties,*" Science 281(5383):1647-1650.

Wang, C. et al. (2009) "*Recent Progress in Syntheses and Applications of Dumbbell-like Nanoparticles,*" Adv. Mater. 21(30):3045-3052.

Wang, Z.L. (2000) "*Transmission Electron Microscopy of Shape-Controlled Nanocrystals and Their Assemblies,*" J. Phys. Chem. B 104(6):1153-1175.

Wu, Y. et al. (2004) "*Single-Crystal Metallic Nanowires and Metal/Semiconductor Nanowire Heterostructures,*" Nature 430(6995):61-65.

Yoshida, S. et al. (1998) "*Reliability of Metal Semiconductor Field-Effect Transistor Using Gan At High Temperature,*" J. Appl. Phys. 84 (5):2940-2942.

Zhang, J. et al. (2009) "*Versatile Strategy for Precisely Tailored Core@Shell Nanostructures with Single Shell Layer Accuracy: The Case of Metallic Shell,*" Nano Lett. 9(12):4061-4065.

Zhang, J. et al. (epub Mar. 26, 2010) "*Nonepitaxial Growth of Hybrid Core-Shell Nanostructures with Large Lattice Mismatches,*" Science 327:1634-1638.

(56) References Cited

OTHER PUBLICATIONS

Zhang, J. et al. (epub Mar. 26, 2010) Supporting Online Material for "*Nonepitaxial Growth of Hybrid Core-Shell Nanostructures with Large Lattice Mismatches*," Science 327:1634-1638.

Zheng, N. et al. (2006) "*One-Step One-Phase Synthesis of Monodisperse Noble-Metallic Nanoparticles and Their Colloidal Crystals*," J. Am. Chem. Soc. 128:6550-6551.

Zheng, X. et al. (2009) "*Nickel/Nickel Phosphide Core-Shell Structured Nanoparticles: Synthesis, Chemical, and Magnetic Architecture*," Chem. Mater. 21:4839-4845.

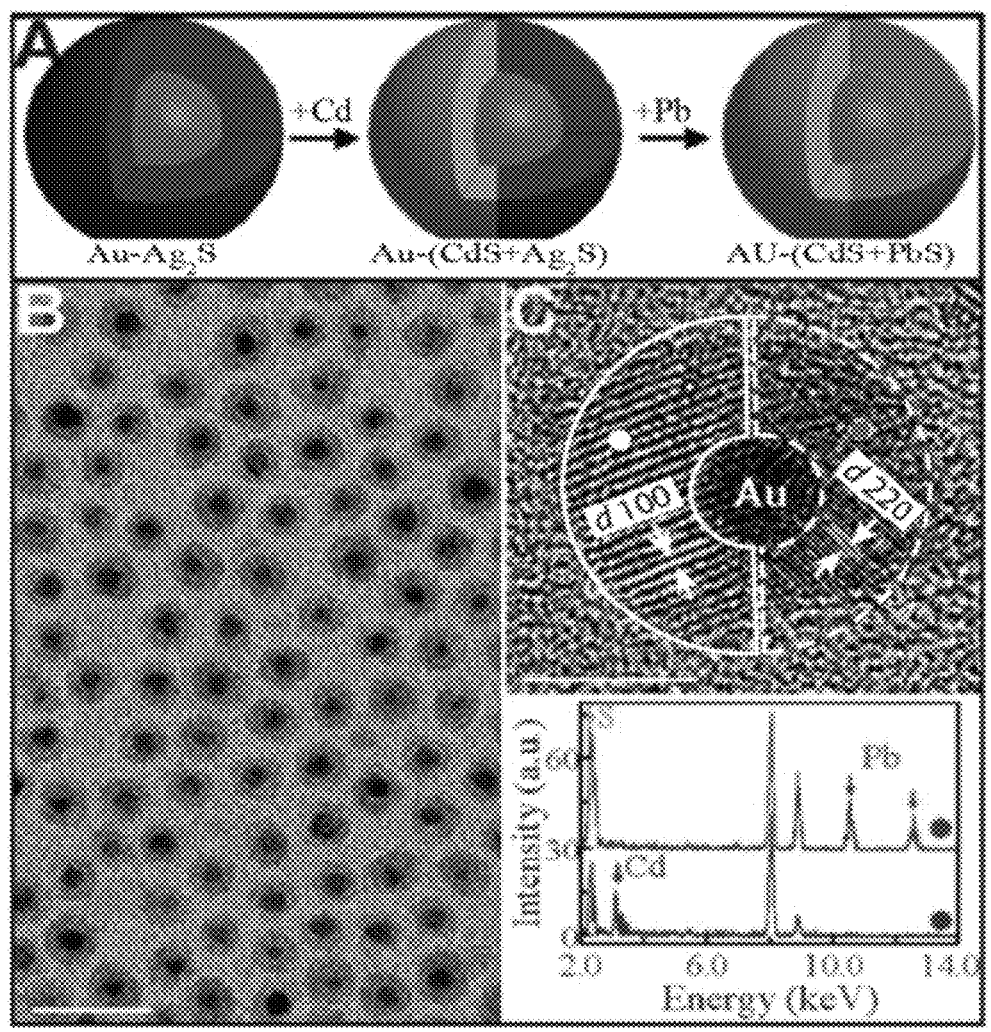
Figure 13 (Panels A-C)

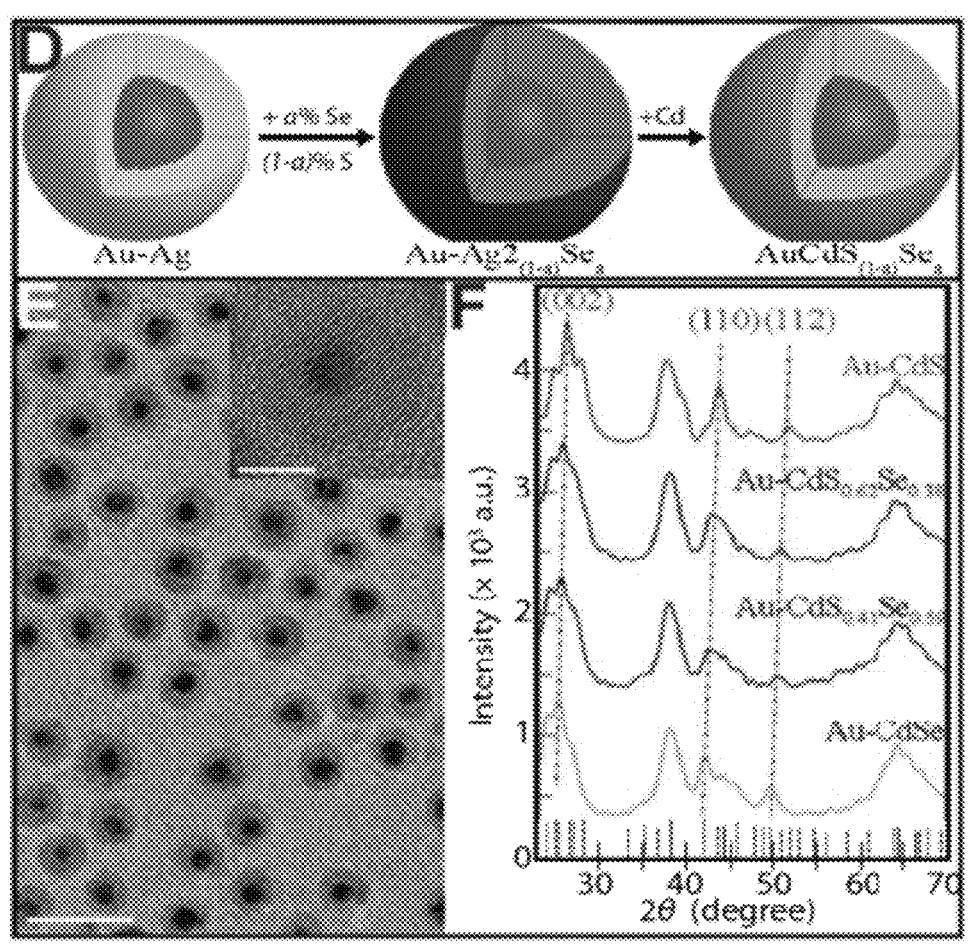
Figure 13 (Panels D-F)

METHODS FOR THE PRODUCTION OF NANOSCALE HETEROSTRUCTURES

CROSS-REFERENCE TO RELATED APPLICATIONS

This application claims priority to U.S. Patent Application Ser. No. 61/467,994 (filed Mar. 26, 2011), which application is herein incorporated by reference in its entirety.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of NSF DMR05747194 and ONR N000140710787 awarded by the National Science Foundation and the Office of Naval Research, respectively.

BACKGROUND OF THE INVENTION

1. Field of the Invention

The present invention is directed to a novel synthetic method for producing nanoscale heterostructures, and particularly nanoscale heterostructures that comprise a metal core and a monocrystalline semiconductor shell with substantial lattice mismatches between them. More specifically, the invention concerns the use of controlled soft acid-base coordination reactions between molecular complexes and colloidal nanostructures to drive the nanoscale monocrystalline growth of the semiconductor shell with a lattice structure incommensurate with that of the core. The invention also relates to more complex hybrid core-shell structures that exhibit azimuthal and radial nano-tailoring of structures. The invention is additionally directed to the use of such compositions in semiconductor devices.

2. Description of Related Art

Semiconductor-metal hybrid heterostructures are promising building blocks for applications in catalytic, magnetic, and opto-electronic devices (Maynor, B. W. et al. (2004) "*Site-Specific Fabrication of Nanoscale Heterostructures: Local Chemical Modification of GaN Nanowires Using Electrochemical Dip-Pen Nanolithography,*" J. Am. Chem. Soc. 126:6409-6413; Alemseghed, M. G. et al. (2011) "*Controlled Fabrication of Colloidal Semiconductor-Metal Hybrid Heterostructures: Site Selective Metal Photo Deposition,*" Chem. Mater. 23:3571-3579). The semiconductor's tunable band gap (300-4000 nm 4.1-0.3 eV) broad and intense absorption ($\epsilon \approx 10^5$-$10^6$ L mol$^{-1}$ cm$^{-1}$), and long-lived exciton (up to 40 ns for CdSe, 1.8 μs for PbS) provide unmatched light absorption and emission capabilities. The metal can serve as an additional chromophore, fluorescence enhancer, paramagnet, or charge-collecting material where carriers localize after exciton quenching. For example, semiconductor-metal hybrid heterostructures have been shown to convert solar energy into potential and chemical energy. They become redox-active upon illumination and remain redox-active after being stored in the dark for several hours. Thus, such structures have utility in a variety of applications including: field-effect transistors (Yoshida, S. et al. (1998) "*Reliability Of Metal Semiconductor Field-Effect Transistor Using Gan At High Temperature,*" J. Appl. Phys. 84 (5):2940-2942; Wu, Y. et al. (2004) "*Single-Crystal Metallic Nanowires And Metal/Semiconductor Nanowire Heterostructures,*" Nature 430(6995):61-65), photodetectors, photodiodes (Endo, H. et al. (2007) "*Schottky Ultraviolet Photodiode Using A ZnO Hydrothermally Grown Single Crystal Substrate,*" Appl. Phys. Lett. 90(12):121906-121908), solar cells (Chandrasekharan, N. et al. (2000) "*Improving the Photoelectrochemical Performance of Nanostructured TiO2 Films by Adsorption of Gold Nanoparticles,*" J. Phys. Chem. B 104(46):10851-10857; Nakato, Y. et al. (2002) "*Effect Of Microscopic Discontinuity Of Metal Overlayers On The Photovoltages In Metal-Coated Semiconductor-Liquid Junction Photoelectrochemical Cells For Efficient Solar Energy Conversion,*" J. Phys. Chem. 92 (8):2316-2324), catalysis (Valden, M. et al. (1998) "*Onset of Catalytic Activity of Gold Clusters on Titania with the Appearance of Nonmetallic Properties,*" Science 281(5383):1647-1650; Subramanian, V. et al. (2004) "*Catalysis with TiO2/Gold Nanocomposites. Effect of Metal Particle Size on the Fermi Level Equilibration,*" J. Am. Chem. Soc. 126(15):4943-4950; Hirakawa, T. et al. (2005) "*Charge Separation and Catalytic Activity of Ag@TiO$_2$ Core—Shell Composite Clusters under UV-Irradiation,*" J. Am. Chem. Soc. 127(11):3928-3934), nanodevice wiring (Lu, W. et al. (2007) "*Nanoelectronics From The Bottom Up,*" Nat. Mater. 6(11):841-850; McAlpine, M. C. et al. (2007) "*Highly Ordered Nanowire Arrays On Plastic Substrates For Ultrasensitive Flexible Chemical Sensors,*" Nat. Mater. 6:379-384; Cui, Y. et al. (2001) "*Nanowire Nanosensors for Highly Sensitive and Selective Detection of Biological and Chemical Species,*" Science 293(5533):1289-1292) and sensing (see, Kundu, P. et al. (epub 15 Dec. 2009) "*Nanoscale Heterostructures with Molecular-Scale Single-Crystal Metal Wires,*" J. Am. Chem. Soc. 132:20-21).

In particular, metal nanoparticles (NPs) having sizes comparable to their electron mean free path possess unusual properties and functionalities (Klimov, V. I. SEMICONDUCTOR AND METAL NANOCRYSTALS: SYNTHESIS AND ELECTRONIC AND OPTICAL PROPERTIES (Marcel Dekker, New York (2003)), serving as model systems to explore quantum and classical coupling interactions as well as providing building blocks for practical applications (Tang, Y. et al. (epub 19 Aug. 2007) "*Tailoring Properties And Functionalities Of Metal Nanoparticles Through Crystallinity Engineering,*" Nature 6:754-759). Such applications include: quantum dot analysis (Collier, C. P. et al. (1997) "Reversible tuning of silver quantum dot monolayers through the metal-insulator transition," Science 277:1978-1981); catalysis (Valden, M. et al. (1998) "*Onset Of Catalytic Activity Of Gold Clusters On Titania With The Appearance Of Nonmetallic Properties,*" Science 281:1647-1650; Zheng, X. et al. (2009) "*Nickel/Nickel Phosphide Core-Shell Structured Nanoparticles: Synthesis, Chemical, and Magnetic Architecture,*" Chem. Mater. 21:4839-4845); nucleic acid detection (Cao, Y. C. (2002) "*Nanoparticles With Raman Spectroscopic Fingerprints For DNA And RNA Detection,*" Science 297:1536-1540); assessing changes in single biomolecules (Sönnichsen, C. et al. (2005) "*A Molecular Ruler Based On Plasmon Coupling Of Single Gold And Silver Nanoparticles,*" Nature Biotechnol. 23:741-745 (2005); Nie, S. et al. (1997) "*Probing Single Molecules And Single Nanoparticles By Surface Enhanced Raman Scattering,*" Science 275:1102-1106) and photonic devices (Sherry, L. J. et al. (2006) "*Localized Surface Plasmon Resonance Spectroscopy Of Single Silver Triangular Nanoprisms,*" Nano Lett. 6:2060-2065); Maier, S. A. et al. (2003) "*Local Detection Of Electromagnetic Energy Transport Below The Diffraction Limit In Metal Nanoparticle Plasmon Waveguides,*" Nature Mater. 2:229-232).

Although advances in strategies for synthesizing metal NPs have enabled control of size, composition and shape (Zheng, N. et al. (2006) "*One-Step One-Phase Synthesis Of Monodisperse Noble-Metallic Nanoparticles And Their Col-* loidal Crystals," J. Am. Chem. Soc. 128:6550-6551; Jin, R. et al. (2003) "Controlling Anisotropic Nanoparticle Growth Through Plasmon Excitation," Nature 425, 487-490; Sun, Y. et al. (2002) "Shape-Controlled Synthesis Of Gold And Silver Nanoparticles," Science 298:2176-2179; Murray, C. B. et al. (2000) "Synthesis and characterization of monodisperse nanocrystals and close-packed nanocrystal assemblies," Annu Rev. Mater. Sci. 30, 545-610; Sun, S. et al. (2000) "Monodisperse FePt nanoparticles and ferromagnetic FePt nanocrystal superlattices," Science 287:1989-1992), the requirement that defects are simultaneously controlled, to ensure essential perfect nanocrystallinity for physics modeling as well as device optimization, is a potentially more significant issue, but has posed substantial technological challenges.

Thus, an ability to precisely control the growth of single-crystal semiconductor-based heterostructures with modulated composition is considered to be a prerequisite for exploring fundamental nanoscale semiconductor physics (Ayers, J. E. (2007) HETEROEPITAXY OF SEMICONDUCTORS: THEORY, GROWTH AND CHARACTERIZATION(CRC Press, New York); Ryzhii, M. et al. (2008) PHYSICS AND MODELING OF TERA- AND NANO-DEVICES (World Scientific, Singapore, 2008) and can offer technological devices with optimum characteristics, including enhanced optical properties with high quantum yields (McBride, J. et al. (2006) "Structural Basis for Near Unity Quantum Yield Core/Shell Nanostructures," Nano Lett. 697):1496-1501), engineered electronic bandgaps (Battaglia, D. et al. (2003) "Colloidal Two-Dimensional Systems: CdSe Quantum Shells and Wells," Angew. Chem. Int. Ed. 42(41): 5035-5039 (2003); Kim, S. et al. (2003) "Type-II Quantum Dots: CdTe/CdSe(Core/Shell) and CdSe/ZnTe(Core/Shell) Heterostructures," J. Am. Chem. Soc. 125 (38): 11466-11467; Smith, A. M. et al. (2010) "Semiconductor Nanocrystals: Structure, Properties, and Band Gap Engineering," Acc. Chem. Res. 43(2):190-200), and various solid-state optoelectronic properties (Klimov, V. I. et al. (2007) "Single-Exciton Optical Gain In Semiconductor Nanocrystals," Nature 447 (7143):441-446; Caruge, J. M. et al. (2008) "Colloidal Quantum-Dot Light-Emitting Diodes With Metal-Oxide Charge Transport Layers," Nat. Photonics 2(4):247-250; E. H. Sargent (2009) "Infrared Photovoltaics Made By Solution Processing," Nat. Photonics 3(6):325-331 (2009). Unintentional crystalline imperfections (such as polycrystallinity, dislocations, and other structural defects) lead to performance degradation or even premature failure of devices. For example, although the optical quality of semiconductor CdSe nanoparticles (NPs) could be improved by an overlayer of epitaxially grown CdS or ZnS, problems appear once the shell thickness becomes larger than the "critical" layer thickness (about two monolayers) due to the existence of strain-induced defects (McBride, J. et al. (2006) "Structural Basis for Near Unity Quantum Yield Core/Shell Nanostructures," Nano Lett. 697): 1496-1501; Chen, X. B. et al. (2003) "Coherency Strain Effects on the Optical Response of Core/Shell Heteronanostructures," Nano Lett. 3(6):799-803; Peng, X. G. et al. (1997) "Epitaxial Growth of Highly Luminescent CdSe/CdS Core/Shell Nanocrystals with Photostability and Electronic Accessibility," J. Am. Chem. Soc. 119(30):7019-7029). Current methods that achieve high-quality monocrystalline heterostructures are all based on epitaxial growth, which requires moderate lattice mismatches (<2%) between the two different materials. Epitaxy refers to the deposition of a crystalline overlayer on a crystalline substrate, where the overlayer is in registry with the substrate. Such a lattice-matching constraint is a severe obstacle, particularly for growth of core-shell nanostructures with (quasi-) spherical core NPs with highly curved surfaces that present many different crystallographic facets (Wang, Z. L. (2000) "Transmission Electron Microscopy of Shape-Controlled Nanocrystals and Their Assemblies," J. Phys. Chem. B 104(6):1153-1175). In addition to such lattice-matching requirements, the issues related to differences in crystal structure, bonding, and other properties have been found to inhibit epitaxial growth of dissimilar hybrid materials such as monocrystalline semiconductors on metals (Palmstrøm, C. J. (1995) "Epitaxy of Dissimilar Materials," Annu Rev. Mater. Sci. 25:389-415).

Attempts to use epitaxy to achieve hybrid core-shell nanostructures have been unsuccessful, resulting in either polycrystalline semiconductor shells or anisotropic structures with segregation of the core and shell, thus limiting their usefulness (Lee, J. S. (2008) "Au-PbS Core-Shell Nanocrystals: Plasmonic Absorption Enhancement and Electrical Doping via Intra particle Charge Transfer," J. Am. Chem. Soc. 130(30):9673-9675; Kim, H. et al. (2005) "Synthesis and Characterization of Co/CdSe Core/Shell Nanocomposites: Bifunctional Magnetic-Optical Nanocrystals," J. Am. Chem. Soc. 127(2):544-546; Mokari, T. et al. (2005) "Formation Of Asymmetric One-Sided Metal-Tipped Semiconductor Nanocrystal Dots And Rods," Nat. Mater. 4(11):855-863 (2005); Mokari, T. et al. (2004) "Selective Growth of Metal Tips onto Semiconductor Quantum Rods and Tetrapods," Science 304(5678):1787-1790; Wang, C. et al. (2009) "Recent Progress in Syntheses and Applications of Dumbbell-like Nanoparticles," Adv. Mater. 21(30):3045-3052; see also, Zhang, J. et al. (2009) "Versatile Strategy for Precisely Tailored Core@Shell Nanostructures with Single Shell Layer Accuracy: The Case of Metallic Shell," Nano letters 9(12): 4061-4065).

Thus, a need exists for improved methods capable of achieving hybrid core-shell nanostructures. In particular, a need exists for a general non-epitaxial growth strategy capable of providing precise control over the formation of the hybrid core-shell nanostructures, so as to permit the production of hybrid core-shell nanostructures whose monocrystalline semiconductor shells are not dependent on the structure of the core nanoparticle (NP). The present invention is directed to this and related needs.

SUMMARY OF THE INVENTION

The present invention is directed to a novel synthetic method for producing nanoscale heterostructures, and particularly nanoscale heterostructures that comprise a metal core and a monocrystalline semiconductor shell with substantial lattice mismatches between them. More specifically, the invention concerns the use of controlled soft acid-base coordination reactions between molecular complexes and colloidal nanostructures to drive the nanoscale monocrystalline growth of the semiconductor shell with a lattice structure incommensurate with that of the core. The invention also relates to more complex hybrid core-shell structures that exhibit azimuthal and radial nano-tailoring of structures. The invention is additionally directed to the use of such compositions in semiconductor devices.

In detail, the invention is directed to a method for producing a nanoscale heterostructure composed of a central metal core and an externally enveloping crystalline semiconductor shell, with more than 2% lattice mismatches between the core and the shell, wherein the method comprises the steps:
  (A) forming an enveloping metal (Me) overlayer over the metal core, the metal core having a diameter of from about 4 nm to about 6 nm; wherein Me is a metal possessing soft Lewis acidity;

(B) incubating the composition (A) in the presence of:
  (1) an anion (X) under conditions sufficient to convert the enveloping metal (Me) overlayer into an enveloping $Me_2X$ shell of amorphous structure; and
  (2) a soft Lewis base (sLB); and
  (3) a transport metal ion ($M^{n+}$)
  under conditions sufficient to cause the expulsion of the Me metal from the $Me_2X$ shell and the formation of a crystalline $M^{n+}$-X shell enveloping the metal core;
thereby forming the nanoscale heterostructure.

The invention particularly concerns the embodiments of such method, wherein the heterostructure is a particle, wire or sheet.

The invention additionally concerns the embodiments of the above-described methods, wherein the central core comprises one or two metals (especially one or two of the metals: Au, Fe, Pd or Pt).

The invention additionally concerns the embodiments of the above-described methods, wherein the metal Me is Ag.

The invention additionally concerns the embodiments of the above-described methods wherein the anion X is $S^{2-}$, $Se^{2-}$ or $Te^{2-}$.

The invention additionally concerns the embodiments of the above-described methods, wherein the soft Lewis base (sLB) is TBP (tri-n-butylphosphate).

The invention additionally concerns the embodiments of the above-described methods wherein the transport metal ion ($M^{n+}$) is Cd, Zn or Pb.

The invention additionally concerns the embodiments of the above-described methods wherein the semiconductor shell comprises one or two semiconductor material(s).

The invention additionally concerns the embodiments of the above-described methods wherein the semiconductor shell has a thickness of from about 2 nm to about 4 nm.

The invention additionally concerns the embodiments of the above-described methods wherein the nanoscale heterostructure possesses more than 20% lattice mismatches between mismatches between the core and the shell.

The invention additionally concerns the embodiments of the above-described methods wherein the nanoscale heterostructure possesses more than 40% lattice mismatches between mismatches between the core and the shell.

The invention additionally concerns a nanoscale heterostructure produced by the above-described methods, and especially a nanoscale heterostructure wherein:
  (a) Me is Ag;
  (b) X is $S^{2-}$, $Se^{2-}$ or $Te^{2-}$;
  (c) sLB is TBP (tri-n-butylphosphate); and
  (d) $M^{n+}$ is Cd, Zn or Pb.

The invention additionally concerns a semiconductor device that comprises a nanoscale heterostructure produced by the above-described methods.

BRIEF DESCRIPTION OF THE DRAWINGS

FIG. 4, Panel B shows corresponding XRD patterns of the different stages illustrated in FIG. 4, Panel A. Bulk Au (solid lines, JCPDS #04-0784), monoclinic Ag2S (dashed lines, JCPDS #14-0072), and wurtzite CdS (dotted lines, JCPDS #41-1049) are provided for reference. Bulk Ag is not shown because its XRD pattern is very similar to that of Au.

FIG. 6, Panel B shows anisotropic Au—CdS dumbbell nanostructures, obtained from FIG. 6, Panel A by following the flowchart (Stages S4-S5 in FIG. 1).

FIG. 13, Panels A-F show the growth of complex hybrid core-shell nanostructures with tailored structures and compositions of the monocrystalline shells. Control of the monocrystalline cation species within the shell: the case of Au—(CdS+PbS) is shown in Panels A-C. Panel A provides a schematic of the growth procedure. Panel B provides large-scale TEM image. Scale bar, 20 nm. Panel C (top) provides a high-resolution TEM image. Solid and dashed arc curves highlight the monocrystalline CdS and PbS shell regimes, respectively. CdS and PbS manifest distinct lattice planes that can be assigned to (d=100) and (d=220), respectively. Scale bar, 5 nm. Panel C (bottom) shows single-particle EDS measurements in the CdS and PbS regimes. Peaks from Cd, Pb, and S elements are highlighted. Panels D-F show control of the monocrystalline anion species within the shell: the case of Au—$CdS_{1-a}Se_a$. Panel D provides a schematic of the growth procedure. Panel E shows a large-scale TEM image. Scale bar, 20 nm. The inset to Panel E shows a high-resolution TEM image of the monocrystalline alloy shell. Scale bar, 5 nm. Panel F shows the XRD patterns highlighting lattice evolution from CdSe to CdS with different ratio a. Bulk Au (solid lines, Joint Committee on Powder Diffraction Standards (JCPDS) #04-0784); wurtzite CdS (dashed lines, JCPDS #41-1049) and wurtzite CdSe (dotted lines, JCPDS#08-0459) are also provided for reference and comparison.

DETAILED DESCRIPTION OF THE INVENTION

"Core@shell" nanostructures represent a very unique constitution integrating different materials, properties, and functionalities into a single unit. As discussed above, this class of nanostructures has shown enormous importance for both fundamental science and technological applications, including enhanced luminescence, biomedical, energy transfer, and fundamental couplings (Zhang, J. et al. (2009) "*Versatile Strategy for Precisely Tailored Core@Shell Nanostructures with Single Shell Layer Accuracy: The Case of Metallic Shell*," Nano letters 9(12):4061-4065).

The present invention is directed to a novel synthetic method for producing nanoscale heterostructures, and particularly nanoscale heterostructures that comprise a metal core and a monocrystalline semiconductor shell with substantial lattice mismatches between them. More specifically, the invention concerns the use of controlled soft acid-base coordination reactions between molecular complexes and colloidal nanostructures to drive the nanoscale monocrystalline growth of the semiconductor shell with a lattice structure incommensurate with that of the core. The invention thus permits the precise, independent and tunable control of both the core and shell dimensions.

Although in preferred embodiments, the invention relates to heterostructures composed of a monolithic core and/or shell, the invention also relates to more complex hybrid core-shell structures (e.g., composed of a core that comprises 2, 3 or more metals and/or a hybrid shell composed of 2, 3 or more materials. Preferably, such hybrid core-shell structures exhibit azimuthal and radial nano-tailoring. The invention is additionally directed to the use of such compositions in semiconductor devices (see, Zhang, J. et al. (epub 26 Mar. 2010) "Nonepitaxial Growth of Hybrid Core-Shell Nanostructures with Large Lattice Mismatches," Science 327:1634-1638 and Zhang, J. et al. (epub 26 Mar. 2010) "Supporting Online Material for Nonepitaxial Growth of Hybrid Core-Shell Nanostructures with Large Lattice Mismatches," Science 327:1634-1638; both of which publications are herein incorporated by reference in their entireties).

As used herein the term "nanoscale" refers to structures having dimensions of from about 1 nm to about 100 nm, and more preferably to structures having dimensions of from about 1 nm to about 10 nm. The term "heterostructure" is intended to denote a nanoscale heterostructure that comprises a metal core and a monocrystalline semiconductor shell.

Figure 3:
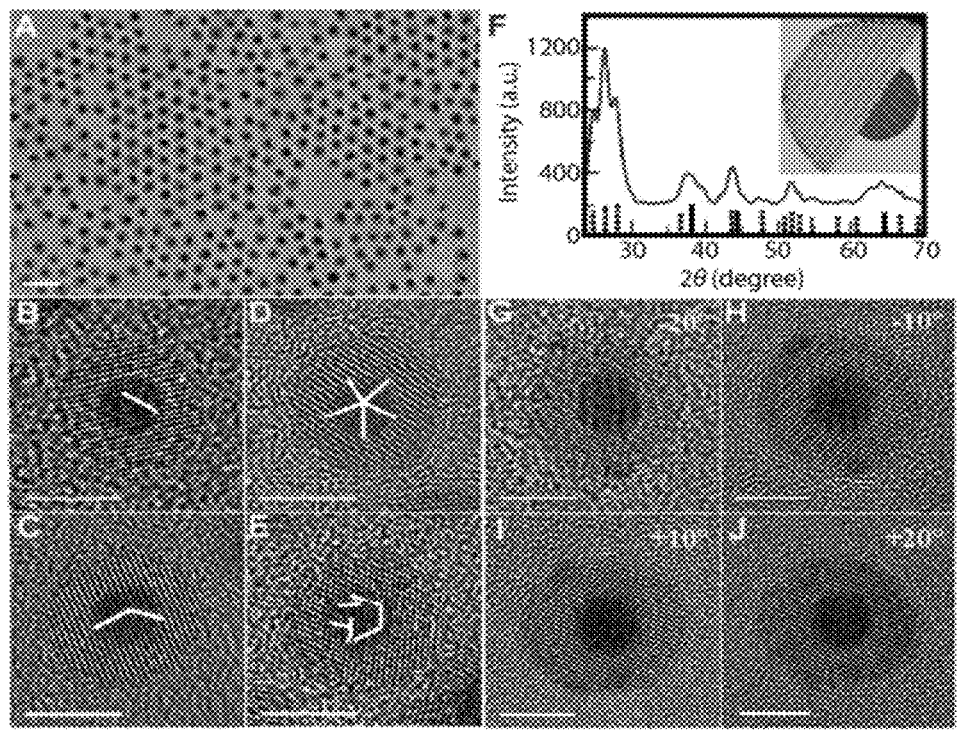
FIG. 3 (Panels A-J) shows Au—CdS core-shell nanostructures with monocrystalline shell. Panel A: Typical TEM image showing uniform core-shell nanostructures. Scale bar, 20 nm. Panels B-E: High-resolution TEM images of core-shell nanostructures from Panel A. Whereas Au core NPs can manifest monocrystalline (Panel B), single-fold twin (Panel C), fivefold twin (Panel D), and multiple-twin (Panel E) lattice structures, all of the CdS shells are monocrystalline. The dotted lines in the core highlight the lattice orientations within the Au core NPs. Scale bar, 5 nm. Panel F: XRD pattern of Au—CdS sample shown in Panel A. Bulk Au [solid lines, Joint Committee on Powder Diffraction Standards (JCPDS) #04-0784] and wurtzite CdS (dashed lines, JCPDS #41-1049) are also provided for reference and comparison. The inset image of Panel F presents a ball-and-stick molecular model of Au—CdS, illustrating a cubic core and wurtzite shell. Panels G-J: Angle-dependent high-resolution TEM characterization. The sample depicted has a larger shell thickness than the one in Panel A to emphasize the extremely high-quality crystallinity of the shell. The CdS shell shows perfect monocrystalline features without detectable structural defects under a different viewing angle. Scale bar, 5 nm.
Figure 4:
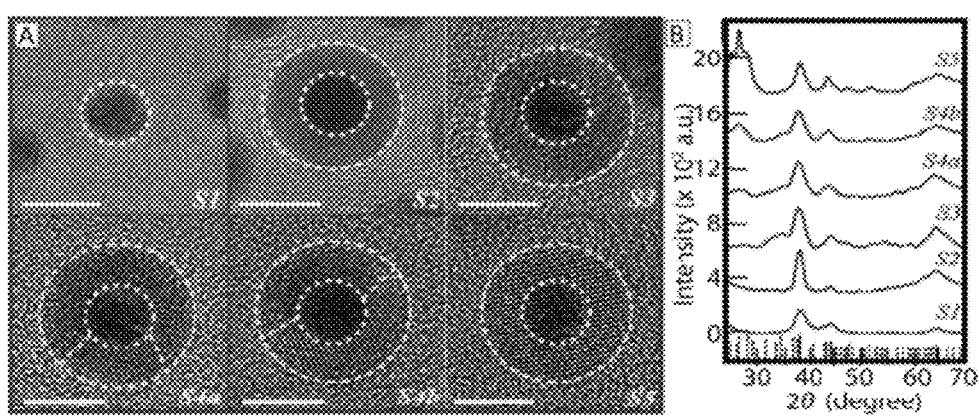
FIG. 4, Panel A shows TEM images highlighting different synthetic stages of the growth of the Au—CdS nanoscale heterostructures of Example 1. Scale bar, 5 nm. Dashed lines are guides for the eye, distinguishing the core and shell boundaries, respectively.

The nanoscale heterostructures of the present invention are preferably particles, rods or sheets. The term "particle" is intended to denote a substantially spherical structure whose three orthogonal axes are of approximately equivalent length, in contrast to a rod. The term "rod" is intended to denote a heterostructure having one axis of elongated length relative to the length of the remaining two orthogonal axes of the structure. Such rods may be of any geometry, such as cylindrical, prismatic (e.g., cuboid, a triangular prism, a right rectangular prism, a hexagonal prism, etc.), etc. The term "sheet" is intended to denote a heterostructure having two axes of elongated length relative to the length of the third orthogonal axis of the structure. Such third axis may have a length that is nominal relative to the lengths of the elongated axes of the sheet (so as to form a substantially flat sheet), or it may have a length relative to such elongated axes that results in significant thickness (i.e., forming a sheet having more than nominal volume). As illustrated in FIGS. 3-4, the metal core of such nanoscale particles will typically comprise a diameter of from about 4 nm to about 6 nm, more typically from about 4 nm to about 5 nm (e.g., 4.2-4.8 nm) and the monocrystalline semiconductor shell will comprise a thickness of from about 2 nm to about 4 nm, more typically from about 2 nm to about 3 nm (e.g., 2.6-2.9 nm). The metal of the core of such nanoscale particles will preferably be Au, Fe, FePt, Pd or Pt (with Au being particularly preferred), however as discussed below, other metals (such as for example, Ag, Co, Cu, Fe, Hg, Pb, Pd, PdO, $Pd_4S$, Pt, PtM (M=Co, Ni) and Sn (see, Alemseghed, M. G. et al. (2011) "Controlled Fabrication of Colloidal Semiconductor-Metal Hybrid Heterostructures: Site Selective Metal Photo Deposition," Chem. Mater. 23:3571-3579), or combinations thereof) may be employed. The monocrystalline semiconductor shell of such nanoscale particles will preferably be composed of CdS, CdSe, CdTe, PbS or ZnS (or combinations thereof), however, other semiconductor materials may be similarly employed.

As used herein, the term "core" refers to an interiorly positioned region within the heterostructure. The term "shell" is intended to refer to a region positioned exteriorly to the core of the heterostructure. In the case of a particle heterostructure, the core will be substantially spherical and will be encased within the shell of the heterostructure. In the case of a rod heterostructure, the core will be elongated along the longest axis of the heterostructure (analogous to the copper core of an insulated wire). In the case of a sheet heterostructure, the core will be elongated along the two longest axes of the heterostructure (analogous to the middle sheet of three stacked sheets of paper).

Significantly, the heterostructures of the present invention preferably exhibit substantial lattice mismatches between the core and the shell. Mismatches are calculated by the conventional definition given by:

$$\text{Mismatch} = \frac{\text{Shell Lattice Parameter} - \text{Core Lattice Parameter}}{\text{Core Lattice Parameter}} \quad (S1)$$

The illustrative core-shell nanostructures of Table 1 represent different integrations of functionalities and properties.

TABLE 1

| Core | Au | Au | Au | Au | Au | FePt | Pt | Pd |
|---|---|---|---|---|---|---|---|---|
| | (111) | (111) | (111) | (111) | (111) | (111) | (100) | (111) |
| Shell | CdS | CdSe | CdTe | PbS | ZnS | CdS | CdS | CdS |
| | (002) | (002) | (111) | (111) | (002) | (002) | (002) | (002) |
| Mismatch (%) | 42.7 | 49.1 | 58.9 | 45.6 | 32.9 | 49.5 | 48.3 | 49.6 |

Thus, the nanoscale heterostructures of the present invention will possess more than 2%, preferably more than 5%, more preferably more than 10%, still more preferably more than 20%, more than 30%, more than 40%, or more than 50%, lattice mismatches.

Because the core and shell do not require the same lattice symmetry and the core can manifest different crystallographic facets on the surface, majority lattice planes of bulk core and shell components (which are determined from XRD experiment) are used in the calculation of the lattice mismatches.

The invention addresses the need for nanoscale heterostructures that comprise a metal core and a monocrystalline semiconductor shell with substantial lattice mismatches between them by providing a general nonepitaxial growth strategy that achieves precise control of the hybrid core-shell nanostructures, whereby the monocrystalline semiconductor shells are not dependent on the structure of the core NPs. In this approach, growth of the core-shell nanostructures is based on the Lewis acid-base reaction mechanism, in which the entire nanostructure is spatially confined by an amorphous matrix. Because monocrystalline growth of the semiconductor shell is fully directed by chemical thermodynamic properties of reactions within the matrix, the shell's lattice structure can be independent of that of the core NPs, thus circumventing the limitations imposed by epitaxial strategies.

In order to understand a variety of coordination reactions and chemical equilibria, typically a dual parameter scale has been applied to represent the acidity (X and Y) of metal ions and the basicity ($\alpha$ and $\beta$) of ligands (Misono, M. et al. (1967) "A New Dual Parameter Scale For The Strength Of Lewis Acids And Bases With The Evaluation Of Their Softness," J. Inorg. Nucl. Chem. 29, 2685-2691):

$$X = \frac{X_i^2}{10} \frac{(X_0 + \sqrt{\Sigma I_n})^2}{10}$$

$$Y = 10\left(\frac{I_n}{I_{n+1}}\right)\left(\frac{r_i}{\sqrt{n}}\right)$$

where X is related to the electronegativity of the metal ions, Y is the softness that expresses the tendency of a metal ion to form a dative π-bond, $X_0$ and $X_i$ are the electronegativity of neutral and ionic metal atoms, respectively. $I_n$ is the n-thionization potential, $r_i$ is the ionic radius of metal ion, and n is the formal charge of metal ion.

Correspondingly, the (α, β) for ligands as soft-bases can be related to (X,Y) through the instability constant of a metal ion complex, K:

$$pK = -\log K = \alpha X + \beta Y + \gamma$$

where γ is a constant determined for each ligand.

According to the Lewis concept of acids and bases, metal ions and ligands are acids and bases, respectively. And the theory of hard-soft acids and bases suggests that hard acid could bind strongly to hard bases and soft acids could bind strongly to soft bases (Pearson, R. G. (1963) "*Hard and Soft Acids and Bases*," J. Am. Chem. Soc. 85(22):3533-3539). The energy associated with a reaction should be correlated with the acidity of the metal ion (Y) and the basicity of the ligand molecule (β). A summary of acidity and basicity of common metal ions and ligands is provided in FIG. 2 and in Table 2, respectively.

Figure 1:
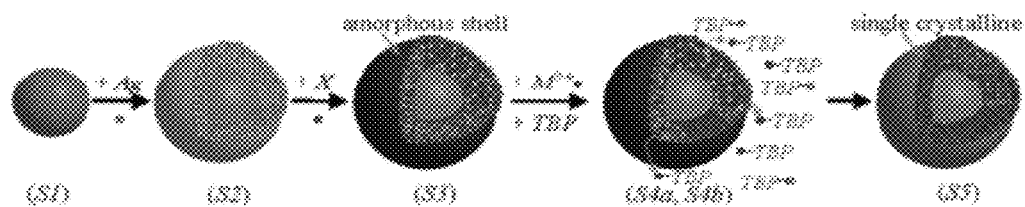
FIG. 1 shows a flowchart of a preferred synthesis protocol for producing the nanoscale heterostructures of the present invention.

The steps of a preferred synthesis protocol are outlined in a flowchart in FIG. 1. The non-epitaxial growth mechanism can be qualitatively understood on the basis of the thermodynamics and coordination chemistry of ionic transformation involved in the growth reactions. Controlling the thermodynamics associated with the chemical transformation processes can initiate and facilitate semiconductor monocrystalline growth in a well-defined amorphous matrix grown outside of the core NPs, and is thus important to the preferred method.

Figure 2:
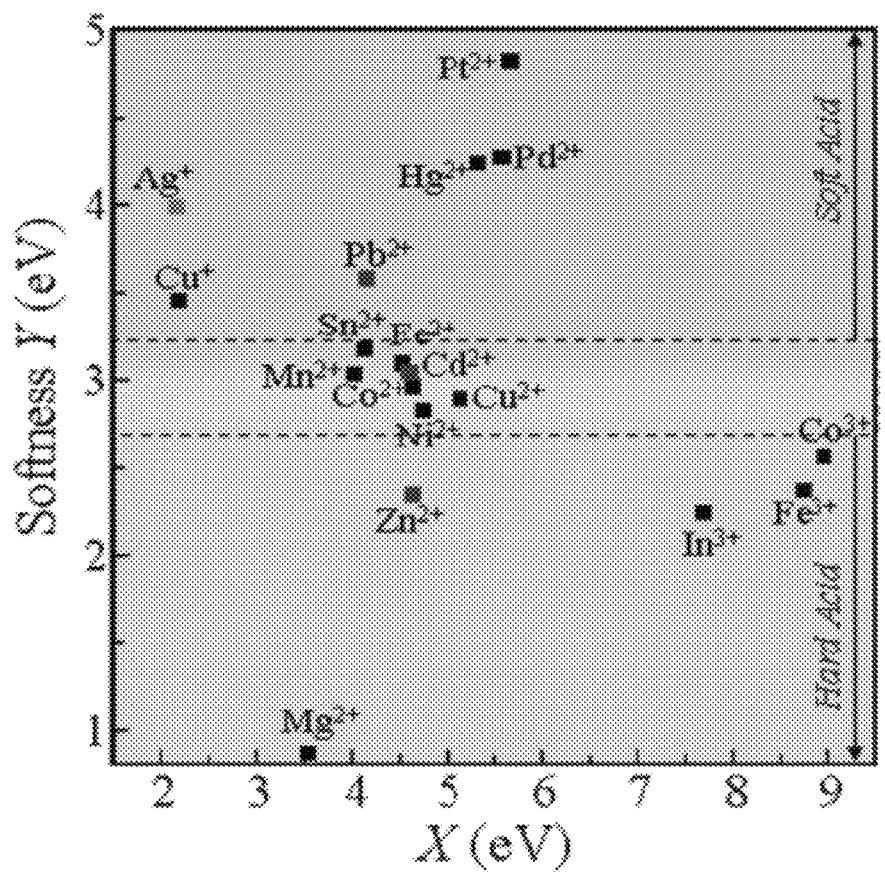
FIG. 2 shows the acidity of common metal ions.

Starting from the core NPs (Stage S1), an overlayer of metal with soft Lewis acidity is grown onto the core (Stage S2) (Smith, A. M. et al. (2009) "*Tuning The Optical And Electronic Properties Of Colloidal Nanocrystals By Lattice Strain,*" Nat. Nanotechnol. 4(1):56-63). For hybrid core-shell structures, the use of a Ag metal overlayer is particularly preferred, based on the following considerations:

(1) According to the theory of hard-soft acids and bases, silver cations behave as a strong acid (acid softness=+3.99) compared with many other common metal cations, such as $Zn^{2+}$, $Pb^{2+}$, and $Cd^{2+}$. Exemplary hard, borderline and soft Lewis acids and bases are shown in FIG. 2 and in Table 2, respectively.

TABLE 2

| Lewis Base | β | Anions |
|---|---|---|
| Hard | <5 | $OAc^-$ (0.16), $acac^-$ (0.19), $OH^-$ (0.40), $NH_3^-$ (1.08), $Cl^-$ (2.49), $NO_3^-$, $RNH_2^-$, $H_2O$ |
| Borderline | 5-6 | $Br^-$ (5.58), $C_6H_5NH_2^-$, $N_3^-$, $NO_2^-$, $SO_2^-$, $N_2$ |
| Soft | >6 | $I^-$ (7.17), $S_2O_3^{2-}$ (12.4), $R_2S(Se,Te)$, $RS(Se,Te)H$, $S(SeTe)^{2-}$, $SO_2^-$, $N_2$ $R_3P$, $R_3As$, $(RO)_3P$, TBP (tri-n-butylphosphate) (wherein R is alkyl) |

Thus, silver cations can easily share their d electrons and coordinate with various soft bases via back-donating p bonds to form a rich family of organometallic complexes. The free energy of reaction (ΔG) is qualitatively determined by the coordination stability of these complexes and can further govern the equilibria of reaction (Pearson, R. G. (1963) "*Hard and Soft Acids and Bases,*" J. Am. Chem. Soc. 85(22):3533-3539; Misono, M. et al. (1967) "*A New Dual Parameter Scale For The Strength Of Lewis Acids And Bases With The Evaluation Of Their Softness,*" J. Inorg. Nucl. Chem. 29, 2685-2691). The high acid softness of silver therefore offers broad thermodynamic control of the synthetic process.

(2) The silver layer can be grown onto a wide variety of core NPs (including metallic, magnetic, and semiconductor core NPs) with precise thickness control down to a single monolayer (Zhang, J. et al. (2009) "*Versatile Strategy for Precisely Tailored Core@Shell Nanostructures with Single Shell Layer Accuracy: The Case of Metallic Shell,*" Nano Lett. 9(12):4061-4065).

(3) The electronegativity of silver is similar to that of many anions X (chalcogenides, As, P) (Anson C. E. et al. (2008) "*Synthesis and Crystal Structures of the Ligand-Stabilized Silver Chalcogenide Clusters [$Ag_{154}Se_{77}(dppxy)_{18}$], [$Ag_{320}(StBu)_{60}S_{130}(dppp)_{12}$], [$Ag_{352}S_{128}(StC_5H_{11})_{96}$], and [$Ag_{490}S_{188}(StC_5H_{11})_{114}$],*" Angew. Chem. Int. Ed. 47(7):1326-1331). Under certain conditions (e.g., appropriate temperature and anion molecular complexes), the silver shells in Stage S2 can be modified to form silver compound shells ($Ag_2X$) with an amorphous structure (Stage S3) (the amorphous feature of $Ag_2S$ in Stage S3 is confirmed from both high-resolution TEM and XRD patterns discussed in Example 1) providing a crucial platform for the next chemical transformation stage, ultimately leading to monocrystalline growth. It has been demonstrated that nanoscale chemical transformations, such as cation exchange, represent a versatile route for converting one crystalline solid to another (Son, D. H. et al. (2004) "*Cation Exchange Reactions in Ionic Nanocrystals,*" Science 306 (5698):1009-1012; Jeong, U. Y. et al. (2005) "*Large-Scale Synthesis Of Single-Crystal CdSe Nanowires Through A Cation-Exchange Route,*" Chem. Phys. Lett. 416(4-6): 246-250). One aspect of the present invention reflects the recognition that this process can be harnessed to drive the single-crystal growth by carefully controlling the thermodynamic properties of the reaction (Hoffman, J. D. (1958) "*Thermodynamic Driving Force in Nucleation and Growth Processes,*" J. Chem. Phys. 29(5):1192-1193):

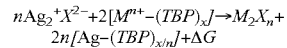

$n Ag_2^+ X^{2-} + 2[M^{n+}-(TBP)_x] \rightarrow M_2X_n + 2n[Ag-(TBP)_{x/n}] + \Delta G$ Tributylphosphine (TBP) is preferred because it is a soft base and can behave as a phase-transfer agent to transport metal ions ($M^{n+}$) to the surface of the core NPs by binding to free cations in solution (Table 2). The high acid softness of $Ag^+$ favors the exchange process between $Ag_+$ in the amorphous matrix and $M^{n+}$ in solution as long as the softness of $M^{n+}$ is small enough to result in a positive ΔG.

This, in turn, provides the impetus to initiate reorganization of the $M_2X_n$ crystalline lattice and to grow into a monocrystalline domain once Ag is completely expelled from the shell (Stages S4a-S4b-S5) (FIG. 1) (Turnbull, D. (1950) "*Formation of Crystal Nuclei in Liquid Metals,*" J. Appl. Phys. 21(10):1022-1028). The processes from Stage S3 to Stage S5 can take from minutes to a few hours depending on the softness of the $M^{n+}$ in solution.

In a typical illustrative synthesis of an Au—CdS core-shell nanostructure, a 5 ml volume of an Au—Ag colloid dissolved in toluene was reacted firstly with a S precursor (pretreated with a mixture of 2 mmol of S powder, 5 ml of Oleylamine and 10 ml of Oleic acid) at room temperature for 30 mins to obtain Au—Ag$_2$S. The Au—Ag$_2$S was separated from solution by centrifugation, washed (to remove residue S precursor) and re-dispersed in 5 ml of toluene. A 2 ml volume of Cd(NO$_3$)$_2$ dissolved in methanol was then added to Au—Ag$_2$S solution and the entire solution was stirred vigorously for 10 min at 50° C. A 0.05 ml volume of TBP was then added to the mixture and stirred vigorously for another 2 hr at 50° C. The final product of Au—CdS was obtained by adding ethanol and centrifuging at 5000 rpm for 20 min.

The as-synthesized 5 ml of Au—CdS core-shell in toluene was mixed with 5 ml of penicillamine in H$_2$O and stirred for 3 hrs at room temperature. Afterwards, the Au—CdS could be transferred to aqueous phase completely. Growth of the second CdSe shell was also accomplished in an aqueous phase. In a typical synthesis, 0.08 g of sodium citrate, 5 ml of CdCl$_2$ (0.01 mol/L), and 2.5 ml of N,N-Dimethylselenourea (0.01 mol/L) was added and reacted at 80° C. for 2 hrs. Such aqueous phase synthesis makes it feasible to directly utilize these hybrid nanostructures for biological applications. As will be appreciate, the volumes and reaction times presented above may be scaled as desired.

Although the above illustration is directed to the production of an Au—CdS core-shell nanostructure, other substituents may be employed in order to provide an array of alternative nanostructures. Typical conditions for such other core-shell nanostructures are summarized in Table 3. It was observed that the quality of the monocrystalline semiconductor shell sensitively depends upon the reaction conditions (such as temperature, precursor preparation and concentration, and time) due to the requirements associated with the thermodynamics of the chemical process.

following examples, which are provided by way of illustration and are not intended to be limiting of the present invention unless specified.

EXAMPLE 1

Synthesis of a Nanoscale Heterostructure

Au—CdS is used as an illustrative example for the synthesis of nanoscale heterostructures using the above-described methods of the present invention.

Materials: Cadmium nitride tetrahydrate (Cd$_{(NO3)}$$_2$.4H$_2$O, 99.999%), silver nitrate (AgNO$_3$, 99+%), Gold(III) chloride trihydate (HAuCl$_4$.3H$_2$O, 99.9+%), Potassium hexachloroplatinate (IV) (K$_2$PtCl$_6$, 98%), Palladium (II) chloride (PdCl$_2$, 99.9+%), Zinc nitrate (Zn(NO$_3$)$_2$.6H$_2$O, 99.0+%), Lead(II) nitrate (Pb(NO$_3$)$_2$, 99.0+%), Sulfur (reagent grade, purified by sublimation, −100 mesh particle size, powder), Selenium (powder, −100 mesh, 99.5+%), Oleic acid (technical grade, 90%), Tributylphosphine (TBP, 97%), Trioctylphosphine (TOP, technical grade, 90%), D-penicillamine (C$_5$H$_{11}$NO$_2$S, 97-100%), N,N-dimethylselenourea ((CH$_3$)$_2$NC(Se)NH$_2$, 97%), Sodium citrate tribasic dehydrate (Na$_3$C$_6$H$_5$O$_7$.2H$_2$O, reagent grade, 99.0%), Toluene (anhydrous, 99.8%), Methanol (anhydrous, 99.8%), and Ethanol (anhydrous, 99.5+%) were purchased from Sigma-Aldrich. Tellurium (99.80%, powder, −200 mesh) and Oleylamine (approximate C18 content 80-90%) were purchased from Acros.

All chemicals were used as-received without further processing. The preparation of all the different core nanopar-

TABLE 3

| Hybrid Core-Shell Nanostructures | Core Ag → Core-Ag$_2$X (X = S, Se, Te) | | | Core Ag$_2$X → Core-MX (M = Cd$^{2+}$, Zn$^{2+}$, Pb$^{2+}$) | | |
|---|---|---|---|---|---|---|
| | Reactants | Time (mins) | Temp. (° C.) | Reactants | Time (mins) | Temp. (° C.) |
| Au—PbS | Au—Ag, S precursor | 30 | R.T | Au—Ag$_2$S, Pb(NO$_3$)$_2$, TBS | 120 | 50 |
| Au—ZnS | Au—Ag, S precursor | 30 | R.T | Au—Ag$_2$S, Zn(NO$_3$)$_2$, TBS | 1200 | 60 |
| Au—CdSe | Au—Ag, Se precursor | 30 | R.T | Au—Ag$_2$Se, Cd(NO$_3$)$_2$, TBS | 120 | 50 |
| Au—CdTe | Au—Ag, Te precursor | 4 | R.T | Au—Ag$_2$Te, Cd(NO$_3$)$_2$, TBS | 10 | 60 |
| Au—CdS$_{1-a}$Se$_a$ | Au—Ag, S precursor, Se precursor | 30 | R.T | Au—Ag$_2$S$_{1-a}$Se$_a$, Cd(NO$_3$)$_2$, TBS | 120 | 50 |
| Au-(p % PbS + (1 − p %) CdS) | Au—Ag S precursorr | 30 | R.T | Au—Ag$_2$S, Cd(NO$_3$)$_2$, Pb(NO$_3$)$_2$, TBS | 15 for Au—Ag$_2$S/CdS); 15 for (p % PbS + (1 − p %) CdS | 60 |
| FePt—CdS | FePt—Ag, S precursor | 30 | R.T | FePt—Ag$_2$S, Cd(NO$_3$)$_2$, TBS | 120 | 50 |
| Pt—CdS | Pt—Ag, S precursor | 30 | R.T | Pt—Ag$_2$S, Cd(NO$_3$)$_2$, TBS | 120 | 50 |
| Pd—CdS | Pd—Ag, S precursor | 30 | R.T | Pd—Ag$_2$S, Cd(NO$_3$)$_2$, TBS | 120 | 50 |

Having now generally described the invention, the same will be more readily understood through reference to the ticles (NPs) as well as the growth of precisely controlled Ag shells are as described in Zhang, J. et al. (2009) ("*Versatile*

Strategy for Precisely Tailored Core@Shell Nanostructures with Single Shell Layer Accuracy: The Case of Metallic Shell," Nano Lett. 9(12):4061-4065).

FIG. 3 highlights the results of Au—CdS growth, where the lattice mismatch between the two majority lattice planes of bulk Au and CdS is up to 43% (Table 1). Large-scale transmission electron microscope (TEM) images (FIG. 3, Panel A) show uniform core-shell nanostructures. The monocrystalline feature of the CdS shell is evident in FIG. 3, Panels B-E. Powder x-ray diffraction (XRD) patterns further confirm that this hybrid core-shell structure grows homogeneously as uniform crystalline domains, and the CdS shells form a hexagonal wurtzite lattice (FIG. 3, Panel F). The XRD features of the CdS shells do not show detectable strain-induced bond-length shifts when compared with bulk-indexed peaks, which is different from previous epitaxially grown core-shell nanostructures with much smaller lattice mismatches (Smith, A. M. et al. (2009) "Tuning The Optical And Electronic Properties Of Colloidal Nanocrystals By Lattice Strain," Nat. Nanotechnol. 4(1):56-63). The perfect crystallinity of the as grown semiconductor shells is further revealed by angle-dependent TEM characterization under various viewing angles (FIG. 3, Panels G-J). This hybrid Au—CdS nanostructure is stable for months without noticeable changes in the overall structure or degradation of the quality of the semiconductor shell.

EXAMPLE 2

Characterization of the Nanoscale Heterostructure

Figure 5:
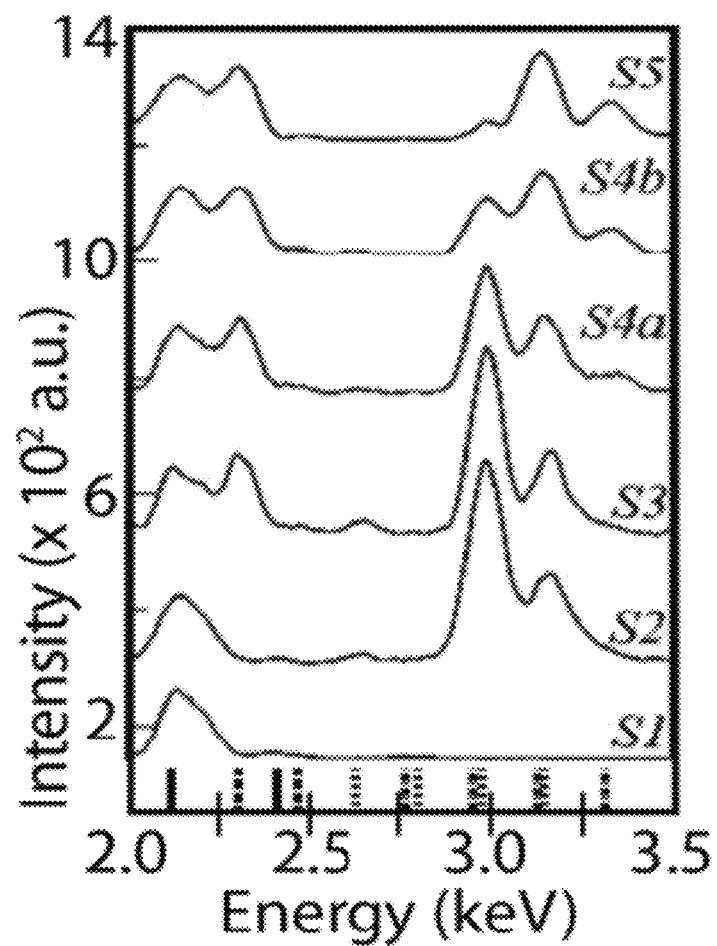
FIG. 5 provides EDS characterization of different growth stages of hybrid Au—CdS nanostructure as described in FIG. 4, Panels A-B. Solid lines, Au; dashed lines, S; dotted lines, Ag; dashed-dotted lines, Cd.

Each growth stage of the Au—CdS nanoscale heterostructures of Example 1 was characterized in detail by high-resolution transmission electron micrograph (TEM) images (FIG. 4, Panel A) and XRD spectroscopy (FIG. 4, Panel B), as well as elemental analysis (Table 1). Bulk EDS peaks are provided to guide the assignment of EDS peaks at each stage (FIG. 5).

Samples for TEM characterization were prepared by adding one drop of toluene solution with the product onto a 300 mesh Copper grid with carbon support film (Ted Pella #01820). JEOL 2100F and JEM 2100 LaB6 TEMs were utilized to characterize size and morphology, and to perform ensemble EDS measurements. The single-particle EDS measurement was performed under STEM mode with a JEOL 2100F.

Samples for XRD measurement were prepared by adding several drops of concentrated product onto silicon (100) wafers and dried at room temperature. A Bruker C2 Discover (Parallel beam) General Area Diffraction Detection (GADDS) system was used for measurement of their diffraction profiles. A monochromatic Cu Kr radiation source (40 mV and 40 mA) was employed along with a Bruker ACS Hi-Star detector.

EXAMPLE 3

Characterization of the Crystalline Quality of the Nanoscale Heterostructures

Figure 6:
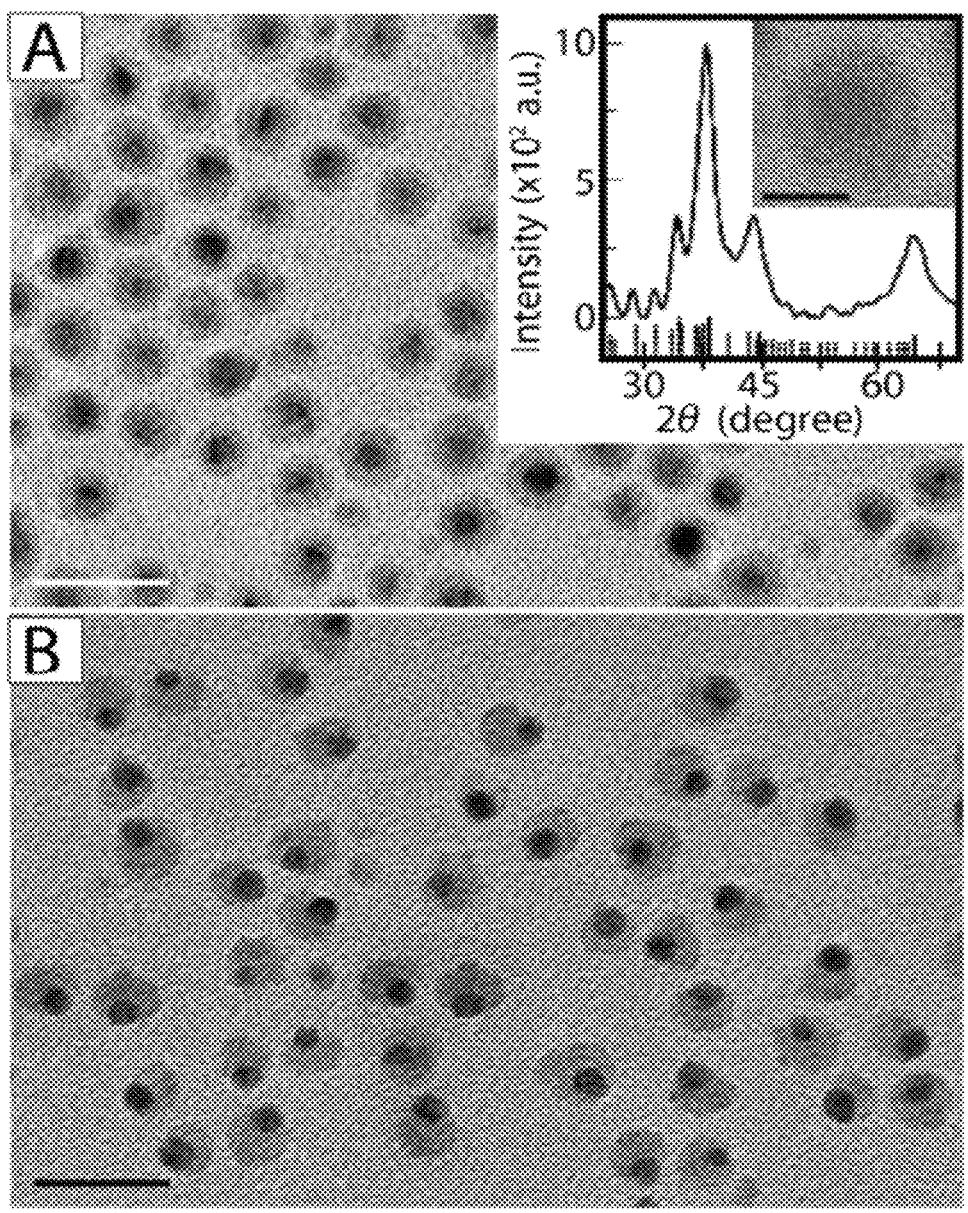
FIG. 6, Panel A shows a large-scale TEM image of Au—$Ag_2S$ with the crystalline Ag2S shells. The overall core-shell morphology shows no difference from the Stage S3 in FIG. 4, Panel A, except that the shells are crystalline. The inset shows an XRD pattern as well as a typical high resolution TEM image of Au—$Ag_2S$, confirming the crystallinity of the $Ag_2S$ shell. XRD patterns of bulk Au (red solid lines, JCPDS#04-0784) and monoclinic Ag2S (green solid lines, JCPDS#14-0072) are provided for reference and comparison.

The effect of an amorphous versus crystalline phase of the $Ag_2X$ shell on the resulting crystalline quality, as well as geometry of the core-shell nanostructures, was also investigated. It was observed that crystalline $Ag_2S$ shells typically led to phase segregation between the core and shell, forming nonconcentric anisotropic shapes (such as dumbbell nanostructures) (FIG. 6).

The CdS shells in such asymmetric nanostructures appeared as either polycrystalline or monocrystalline. By contrast, amorphous $Ag_2X$ shells not only provided a well-defined regime for cation exchange (thus defining the dimensions of the monocrystalline semiconductor shells in Stage S5), but also promoted the motion of the ions inside the shells as well as the growth of the monocrystalline domain of $M_2X$, due to a reduction of interfacial and grain boundary energies between amorphous $Ag_2X$ and crystalline $M_2X_n$ (Turnbull, D. (1950) "Formation of Crystal Nuclei in Liquid Metals," J. Appl. Phys. 21(10):1022-1028; Bording, J. K. et al. (2000) "Molecular-Dynamics Simulation Of Growth Of Nanocrystals In An Amorphous Matrix," Phys. Rev. B 62912):8098-8103).

Figure 7:
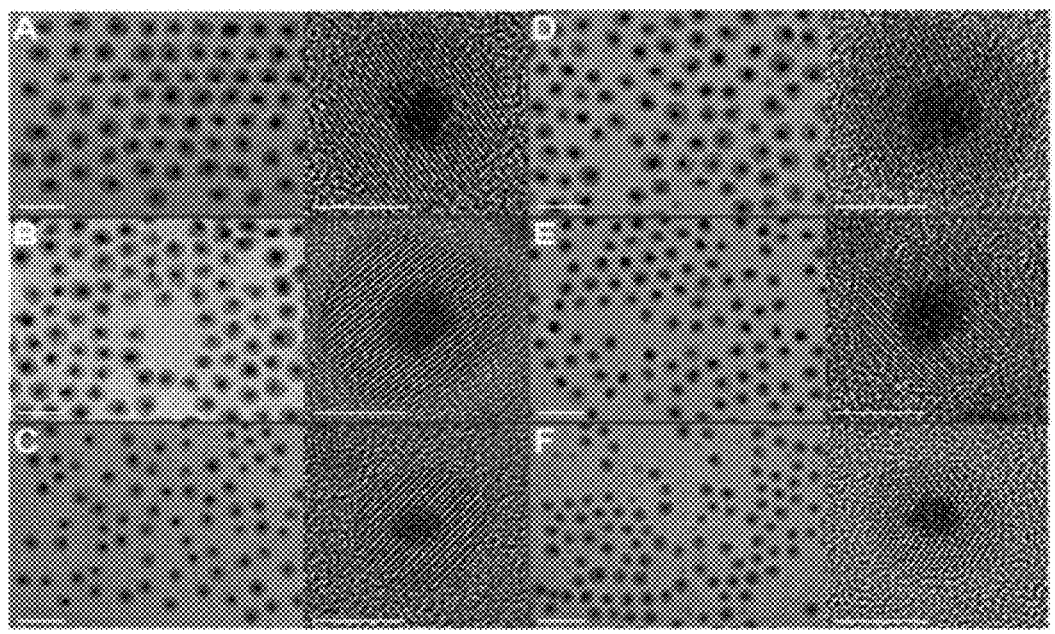
FIG. 7, Panels A-F, show large-scale (left) and high-resolution (right) TEM images of different hybrid core-shell nanostructures with various combinations of the core and shell components. All semiconductor shells show monocrystalline features. Scale bars for large-scale and high-resolution TEM images are 20 and 5 nm, respectively. (A) Au—CdSe; (B) Au—CdTe; (C) FePt—CdS; (D) Au—PbS; (E) Au—ZnS; and (F) Pt—CdS.
Figure 8:
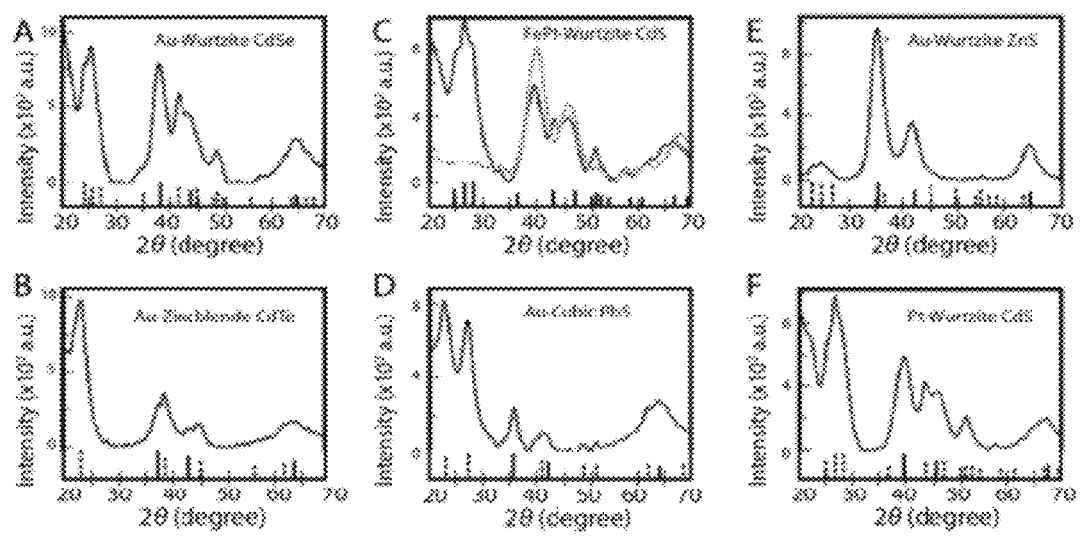
FIG. 8, Panels A-F show XRD patterns of the various hybrid core-shell nanostructures presented in FIG. 7. Panel A: Au—CdSe, showing wurtzite CdSe shell. Bulk Au (solid lines, JCPDS#04-0784) and wurtzite CdSe (dashed lines, JCPDS#08-0459) are provided for reference and comparison. Panel B: Au—CdTe, showing zincblende CdTe shell. Bulk Au (solid lines, JCPDS#04-0784) and zincblende CdTe (dashed lines, JCPDS#15-0770) are provided for reference and comparison. Panel C: FePt—CdS, showing wurtzite CdS shell. XRD patterns of bulk wurtzite CdS (solid lines, JCPDS#41-1049) and pure FePt core NPs (dotted curve) are provided for reference and comparison. Panel D: Au—PbS, showing cubic PbS shell. Bulk Au (solid lines, JCPDS#04-0784) and cubic PbS (dashed lines, JCPDS#05-0592) are provided for reference and comparison. Panel E: Au—ZnS, showing wurtzite ZnS shell. Bulk Au (solid lines, JCPDS#04-0784) and wurtzite ZnS (dashed lines, JCPDS#36-1450) are provided for reference and comparison. Panel F: Pt—CdS, showing wurtzite CdS shell. Bulk Pt (solid lines, JCPDS#04-0802) and wurtzite CdS (dashed lines, JCPDS#41-1049) are provided for reference and comparison.
Figure 9:
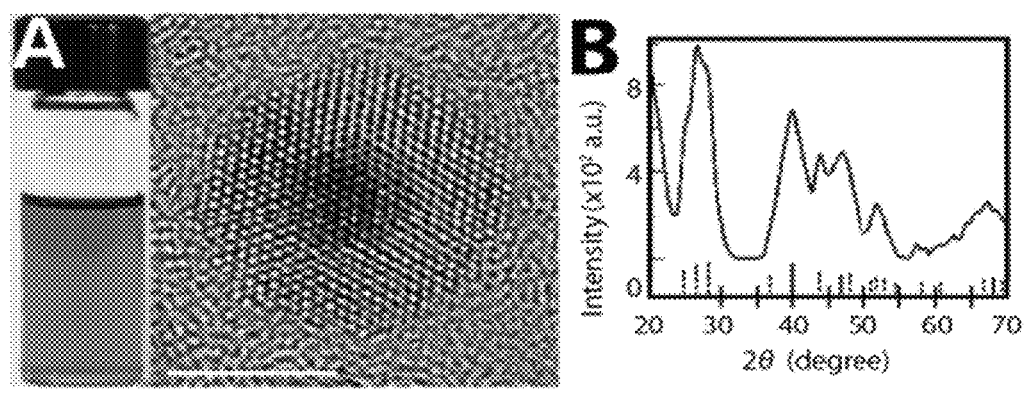
FIG. 9, Panels A-B show Pd—CdS integrating functionalities of catalysis and semiconductor. Panel A is a high resolution TEM image showing monocrystalline CdS shell and disordered Pd core lattice (Right) and a photograph of a vial of solution containing Pd—CdS nanostructures (Left). Panel B shows the XRD pattern of Pd—CdS. Bulk Pd (solid lines, JCPDS#05-0681) and wurtzite CdS (dashed lines, JCPDS#41-1049) are provided for reference and comparison.

According to the above-proposed growth mechanism, the methods of the present invention are readily applicable to other semiconductor hybrid systems as long as the softness of $M^{n+}$ is less than that of $Ag^+$ to achieve positive $\Delta G$ (FIG. 2). To demonstrate such versatility, different combinations of uniformly grown hybrid systems (Tables 1 and 3) produced using the methods of the present invention are shown in FIGS. 7-9. FIG. 7 shows nanoscale Heterostructures of: (A) Au—CdSe; (B) Au—CdTe; (C) FePt—CdS; (D) Au—PbS; (E) Au—ZnS; and (F) Pt—CdS. FIG. 8 shows the XRD patterns for: (A) Au-Wurtzite CdSe, (B) Au-Zincblende CdTe, (C) FePt-Wurtzite CdS, (D) Au-Cubic PbS, (E) Au-Wurtzite ZnS and (F) Pt-Wurtzite CdS. FIG. 9 shows Pd—CdS integrating functionalities of catalysis and semiconductor. For all the systems, the monocrystalline features of the semiconductor shell, whose lattice structure was determined from XRD measurements (FIG. 8), are independent of the core NPs. Similar to the results of Au—CdS, XRD measurements of all hybrid core-shell nanostructures confirm that there is no evidence of strain-induced lattice changes in the semiconductor shell.

EXAMPLE 4

Precision Control of the Thickness of the Monocrystalline Shell

Figure 10:
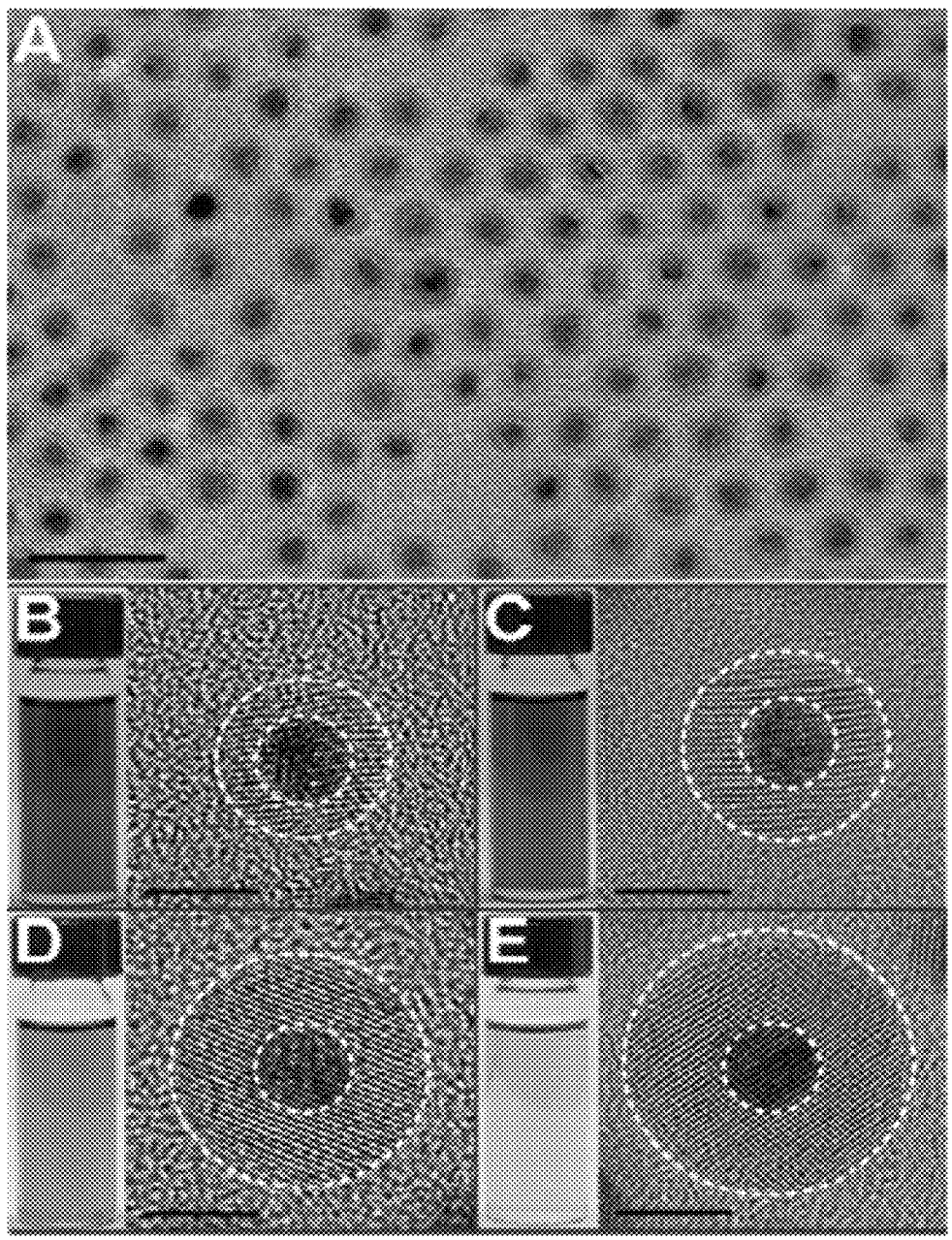
FIG. 10, Panels A-E, shows the precise control of the monocrystalline shell thickness of hybrid Au—CdS nanostructures with identical Au core sizes (4.3 nm). Panel A: Typical large-scale TEM image of the sample highlighted in Panel B, showing the uniformity and homogeneity. For all other samples with different shell thicknesses (such as those shown in Panels C-E), similar sample quality comparable to that of the sample highlighted in Panel B and in FIG. 3, Panel A can always be achieved. Panels B-E: Visible properties and high resolution TEM images of Au—CdS with different shell thicknesses of Panel B (1.6 nm); Panel C (2.2 nm); Panel D (3.4 nm); Panel E: (4.4 nm). Because of quantum confinement effects the monocrystalline CdS shells with different thicknesses possess distinct optical properties, which leads to different coupling with surface plasmon resonance from the metallic Au core NPs, therefore different colors are manifested in the different vials of solution. Dotted circles have been added to the Figure to denote the boundaries of the core and shell.
Figure 11:
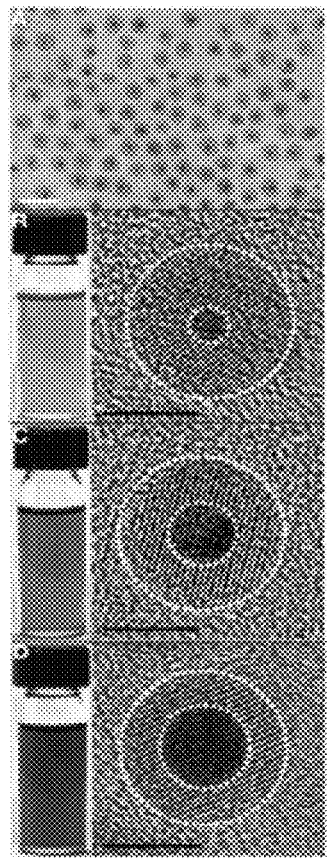
FIG. 11, Panels A-D show hybrid Au—CdS nanostructures possessing identical overall sizes (8.6 nm) but different Au core sizes. Panel A: Typical large-scale TEM image showing uniformity and homogeneity of core-shell nanostructures of Panel B. Scale bar, 20 nm. For all other samples with different core sizes (such as Panel C and Panel D), similar sample quality can always be achieved. Panels B-D: High resolution TEM images showing the monocrystalline CdS shell with different Au core sizes. Scale bar, 5 nm. Panel B: 2.0 nm Au core. Panel C, 3.5 nm Au core. Panel D: 4.6 nm Au core. Metallic Au core NPs with different core size possess distinct optical absorption strengths of the surface plasmon resonances, which lead to the various colors of solution as shown.
Figure 12:
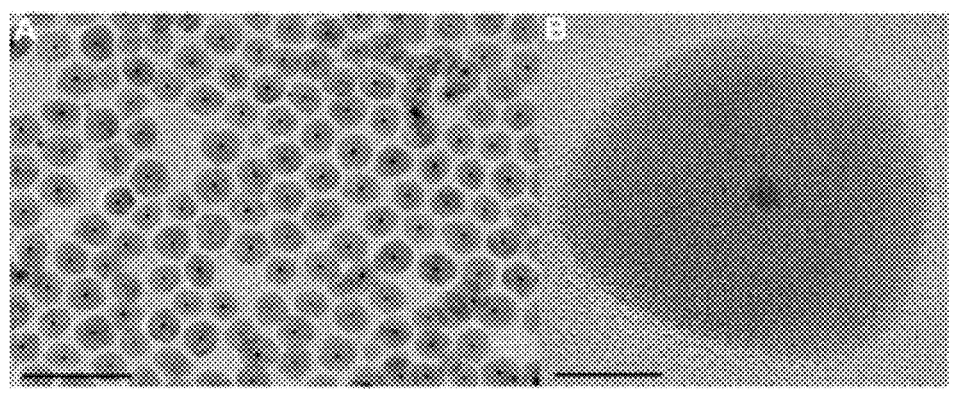
FIG. 12, Panels A-B show Au—CdS with a giant monocrystalline CdS shell thickness of 18 nm. Panel A: Large-scale TEM image. Scale bar, 100 nm. Panel B: High resolution TEM image, clearly demonstrating the monocrystalline CdS shell with a 3.3 nm core in the center. The overall morphology is quasi-spherical due to hexagonal symmetry of a wurtzite lattice. Scale bar, 10 nm.

One of the important merits of conventional epitaxial growth techniques is precise thickness control. In the nonepitaxial approach of the present invention, similar precise control of the monocrystalline semiconductor shell layer is achievable because the preceding Ag growth (Stage S2) is controllable down to a single monolayer (Zhang, J. et al. (2009) "Versatile Strategy for Precisely Tailored Core@Shell Nanostructures with Single Shell Layer Accuracy: The Case of Metallic Shell," Nano Lett. 9(12):4061-4065). As an example, precise and independent control of the core and shell sizes in Au—CdS is shown in FIG. 10 and FIG. 11. Because the optical properties of the semiconductor shell and metal core are dependent on their dimensions (due to quantum confinement and surface plasmon resonance effects, respectively), the independent control of both the shell and core dimensions provided by the present invention can lead to tunable optical properties, as demonstrated in FIG. 10 and FIG. 11. An additional advantage of the methods of the present invention is the clear absence of a critical layer thickness intrinsic in epitaxial growth techniques (Ayers, J. E. (2007) HETEROEPITAXY OF SEMICONDUCTORS: THEORY, GROWTH AND CHARACTERIZATION (CRC Press, New York)). For instance, the monocrystalline CdS shells were grown up to 15 nm thick onto Au core NPs without detectable structural defects (FIG. 12).

EXAMPLE 5

Complex Nanoscale Heterostructures

Figure 14:
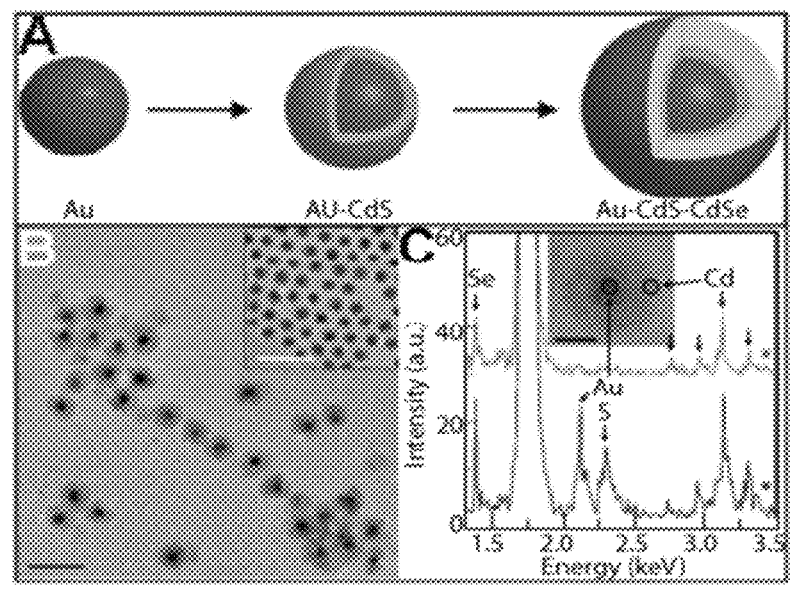
FIG. 14, Panels A-C show radial control of hybrid core-shell nanostructures. Panel A: Schematic growth procedure of the core-shell-shell nanostructures. Panel B: large-scale TEM images of the Au—CdS—CdSe and the Au—CdS (inset) prepared from aqueous phase. Scale bars, 20 nm. Panel C: Single-particle EDS measurements taken at different locations as highlighted in high resolution TEM image of a Au—CdS—CdSe (inset), confirming the core-shell-shell nanostructures. Scale bar, 5 nm.

The methods of the present invention can be used to make more complex nanoscale heterostructures with precise structural and compositional tailoring. FIG. 13 and FIG. 14 highlight three examples of complex heterostructures with independent azimuthal and radial engineering of hybrid core-shell nanostructures.

Figure 15:
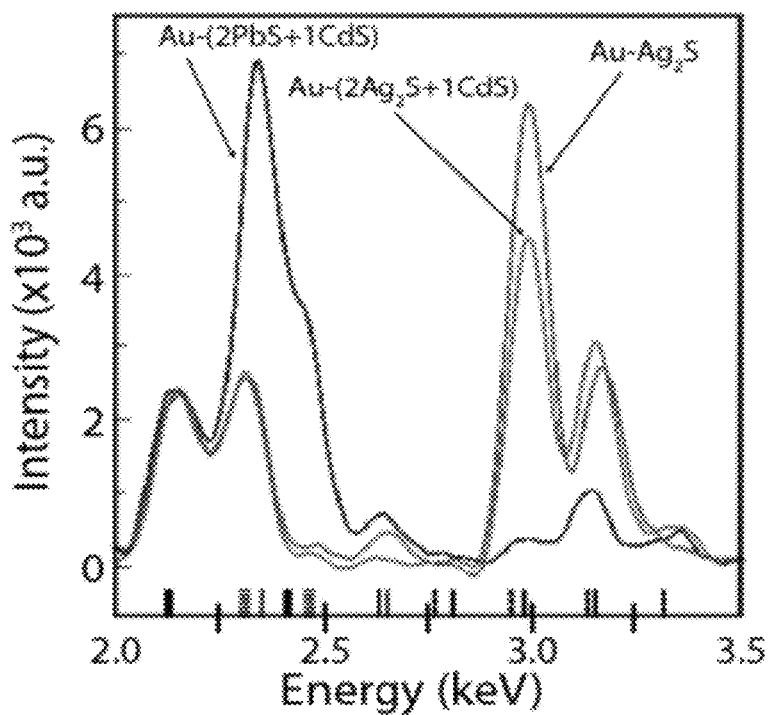
FIG. 15 provides EDS characterization of different growth stages of Au-(2PbS+CdS) nanostructures. Bulk EDS peaks are provided to guide the assignment of EDS peaks at each stage: Au (thick solid lines); Ag (thin solid lines); S (thick dotted lines); Pb (thin dotted lines; Cd (dashed lines).
Figure 16:
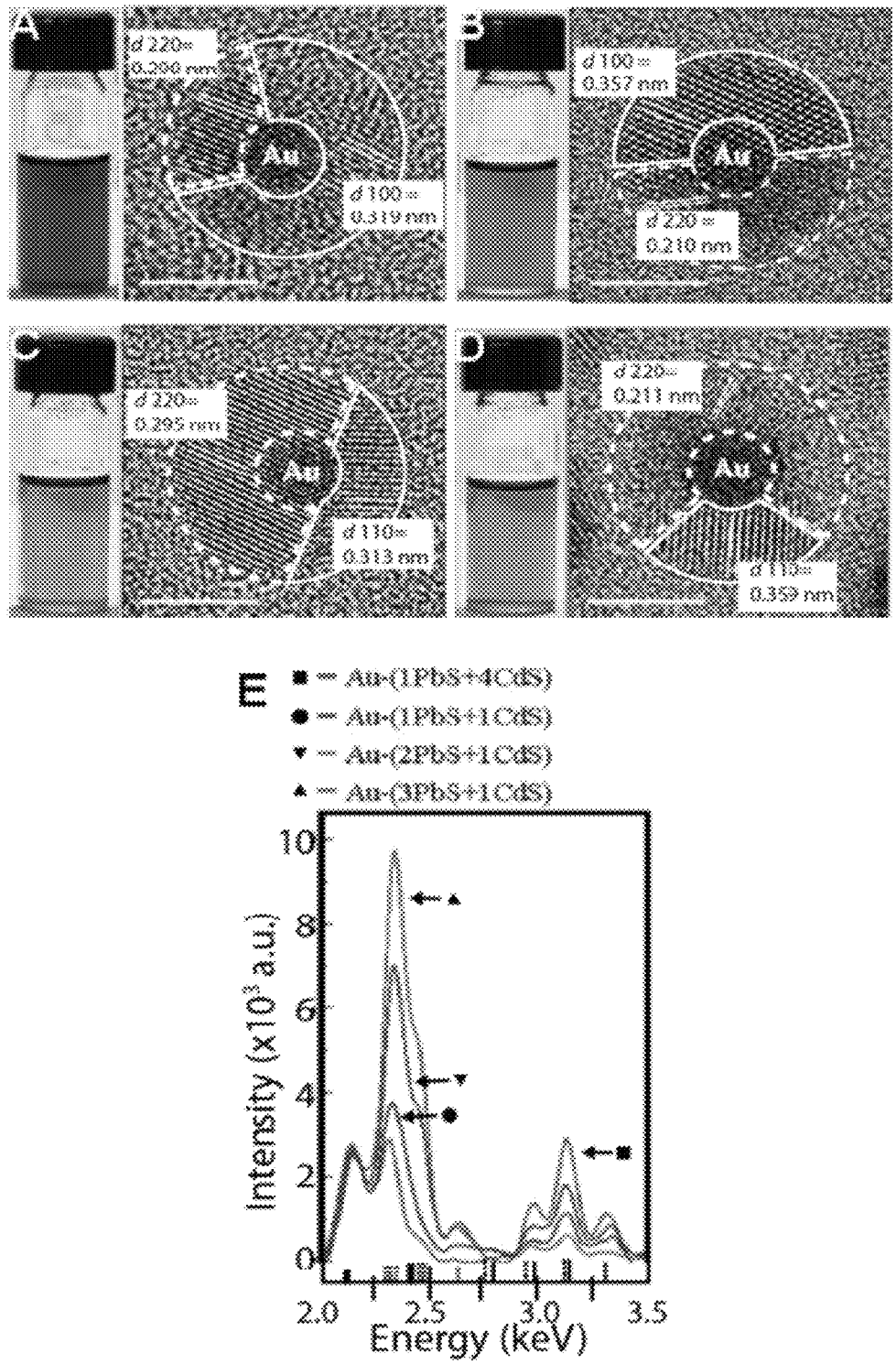
FIG. 16, Panels A-E show hybrid Au-(p % PbS+(1−p) % CdS) nanostructures with tunable ratio p. Panels A-D show high resolution TEM images of Au-(p % PbS+(1−p) % CdS) nanostructures with photographs of vials containing the solution on the left side of each panel. The vials show different colors originating from the hybrid nanostructures. Scale bar, 5 nm. In a high resolution TEM image of such a core-shell nanostructure, the solid arc curves highlight the regime of the monocrystalline CdS shells, and the dashed dashed arc curves highlight the regime of the monocrystalline PbS shells. The ratio of PbS/CdS is obtained from ensemble EDS measurements. Panel A: PbS/CdS=25%. Panel B: PbS/CdS=100%. Panel C: PbS/CdS=200%. Panel D: PbS/CdS=300%. The solution color changes with the ratio, highlighting the unique tunable optical properties. Panel E shows EDS measurements of the nanostructures of Panels A-D. Bulk EDS peaks are provided to guide the assignment of EDS peaks at each stage: Au (thick solid lines); Ag (thin solid lines); S (thick dotted lines); Pb (thin dotted lines; Cd (dashed lines).

In FIG. 13, Panel A, half of the amorphous Ag2S is first converted into monocrystalline CdS shells followed by sequential growth of PbS (this process can be confirmed by monitoring the compositional changes at each stage, as shown in FIG. 15. Large-scale TEM images show that this controlled process can preserve the uniformity of the nanostructures (FIG. 13, Panel B). High-resolution TEM images reveal two distinct monocrystalline lattices split 50/50 with a Au core in the center, as evidenced by single-particle energy-dispersive x-ray spectroscopy (EDS) measurement (FIG. 13, Panel C). Enabled by such, multiple monocrystalline semiconductors can be seamlessly integrated into a single core-shell unit with a precisely tunable ratio of different components (FIG. 16).

Figure 17:
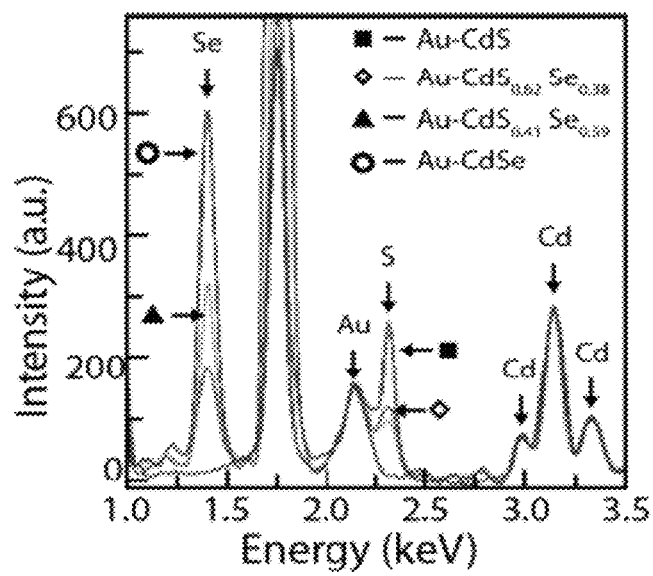
FIG. 17 shows EDS measurements of Au—$CdS_{1-a}Se_a$ nanostructures, showing evolution of S and Se elements with different ratio a values. Peaks originating from Au, Cd, S and Se are highlighted by arrows.

Whereas FIG. 13, Panels A-C, demonstrate integration of the monocrystalline cation species within the shell, FIG. 13, Panels D-F, illustrate the fine control of anion species provided by the present invention. Ternary single-crystal $CdS_{1-a}Se_a$ alloys represent an important semiconductor with a band-gap and lattice constant monotonically tunable by the ratio a. They can exhibit large nonlinear susceptibilities, as well as desirable photoconductive properties, and offer promising technological applications, such as a tunable laser (Pan, A. L. et al. (2006) "*High-Quality Alloyed $CdS_xSe_{1-x}$ Whiskers as Waveguides with Tunable Stimulated Emission,*" J. Phys. Chem. B 110(45):22313-22317). FIG. 13, Panel D schematically shows the procedure for growing a monocrystalline $CdS_{1-a}Se_a$ alloy shell in a typical hybrid core-shell nanostructure, which begins with the reaction of the silver shell formed in Stage S2 with a mixture of S and Se organo-complexes (with a predetermined ratio) developing an amorphous $Ag_2S_{1-a}Se_a$ shell followed by sequential cation exchange with $Cd^{2+}$. FIG. 13, Panel E shows the uniformity as well as monocrystalline features of such an alloy shell grown onto Au core NPs. EDS measurements confirm that the atomic ratio of (S+Se)/Cd is very close to 1, which suggests formation of a ternary phase, but the ratio a is tunable in the monocrystalline shell layer (FIG. 17). Powder XRD measurements reveal the lattice evolution of this ternary alloy as a continuous function of ratio a from pure wurtzite CdSe to wurtzite CdS; decreasing the S concentration increases the lattice constant of the monocrystalline alloy shell layer.

Figure 18:
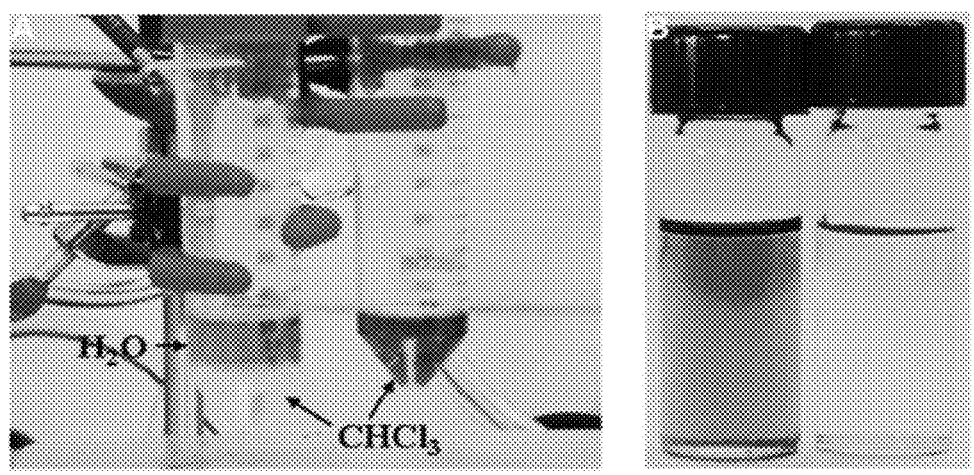
FIG. 18, Panels A-B show aqueous phase synthesis of the hybrid Au—CdS—CdSe nanostructures. Panel A: Phase transfer of as-synthesized Au—CdS from organic chloroform to an aqueous phases. Panel B: Distinct color difference between Au—CdS (Left) and Au—CdS—CdSe (Right) in the aqueous phase.

The excellent stability and monocrystalline quality of the as-synthesized core-shell nanostructures indicate that the semiconductor shells can be further applied as a template for continual growth of different shell layers along the radial direction; one such example of hybrid Au—CdS—CdSe coreshell-shell nanostructure is presented in FIG. 14. It has been demonstrated that through coupling with surface plasmons in metallic nanostructures, the luminescence intensity of the fluorophores can be significantly enhanced, depending on coupling strength (Shimizu, K. T. et al. (2002) "*Surface-Enhanced Emission from Single Semiconductor Nanocrystals,*" Phys. Rev. Lett. 89(11):117401-117402; Jin, Y. D. et al. (2009) "*Plasmonic Fluorescent Quantum Dots,*" Nat. Nanotechnol. 4(9):5710576 (2009); Pompa, P. P. et al. (2006) "*Metal-Enhanced Fluorescence Of Colloidal Nanocrystals With Nanoscale Control,*" Nat. Nanotechnol. 1(2):126-130). Therefore, this radial engineering of the hybrid core-shell-shell nanostructures offers a precise and controllable way to explore such enhancements by tuning the thickness of the CdS shells, that is useful for interfacing with biological systems with enhanced bioimaging and biolabeling capability. Aqueous phase synthesis of the hybrid Au—CdS—CdSe nanostructures can be conducted (phase transfer of as-synthesized Au—CdS from organic chloroform to an aqueous phase). Distinct color differences between Au—CdS and Au—CdS—CdSe in the aqueous phase are noted (FIG. 18).

All publications and patents mentioned in this specification are herein incorporated by reference to the same extent as if each individual publication or patent application was specifically and individually indicated to be incorporated by reference in its entirety. While the invention has been described in connection with specific embodiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the essential features hereinbefore set forth.

What is claimed is:

1. A method for producing a nanoscale heterostructure composed of a central metal core and an externally enveloping crystalline semiconductor shell, with more than 2% lattice mismatches between said core and said shell, wherein said method comprises the steps:
   (A) forming an enveloping metal (Me) overlayer over said metal core, said metal core having a diameter of from about 4 nm to about 6 nm; wherein Me is a metal possessing soft Lewis acidity;
   (B) incubating said composition (A) in the presence of:
      (1) an anion (X) under conditions sufficient to convert said enveloping metal (Me) overlayer into an enveloping $Me_2X$ shell of amorphous structure; and
      (2) a soft Lewis base (sLB); and
      (3) a transport metal ion ($M^{n+}$)
      under conditions sufficient to cause the expulsion of said Me metal from said $Me_2X$ shell and the formation of a crystalline $Mn^{n+}$-X shell enveloping said metal core;
   thereby forming said nanoscale heterostructure.

2. The method of claim 1, wherein said heterostructure is a particle, wire or sheet.

3. The method of claim 1, wherein said metal Me is Ag.

4. The method of claim 1, wherein said anion X is $S^{2-}$, $Se^{2-}$ or $Te^{2-}$.

5. The method of claim 1, wherein said soft Lewis base (sLB) is TBP (tri-n-butylphosphate).

6. The method of claim 1, wherein said transport metal ion ($M^{n+}$) is Cd, Zn or Pb.

7. The method of claim 1, wherein said semiconductor shell comprises one or two semiconductor material(s).

8. The method of claim 1, wherein said semiconductor shell comprises a single semiconductor material.

9. The method of claim 1, wherein said semiconductor shell has a thickness of from about 2 nm to about 4 nm.

10. The method of claim 1, wherein said nanoscale heterostructure possesses more than 20% lattice mismatches between said core and said shell.

11. The method of claim 1, wherein said nanoscale heterostructure possesses more than 40% lattice mismatches between said core and said shell.

12. A semiconductor device that comprises a nanoscale heterostructure produced by the method of claim 1.

13. A nanoscale heterostructure produced by the method of claim 1.

14. The nanoscale heterostructure of claim 13, wherein:
(a) Me is Ag;
(b) X is $S^{2-}$, $Se^{2-}$ or $Te^{2-}$;
(c) sLB is TBP (tri-n-butylphosphate); and
(d) $M^{n+}$ is Cd, Zn or Pb.

15. The method of claim 1, wherein said central core comprises one or two metals.

16. The method of claim 15, wherein said metal of said central core comprises Au, Fe, Pd or Pt.

17. The method of claim 16, wherein said central core comprises a single metal.

18. The method of claim 17, wherein said single metal of said central core is Au, Pd or Pt.

19. The method of claim 18, wherein said single metal is Au.

\* \* \* \* \*